United States Patent
Ma et al.

(10) Patent No.: US 9,942,682 B2
(45) Date of Patent: *Apr. 10, 2018

(54) IMPLEMENTATION METHOD AND DEVICE OF MULTI-BIT MODULATION-BASED DIGITAL SPEAKER SYSTEM

(71) Applicant: SUZHOU SONAVOX ELECTRONICS CO., LTD, Jiangsu (CN)

(72) Inventors: Dengyong Ma, Suzhou (CN); Jun Yang, Suzhou (CN); Jianming Zhou, Suzhou (CN); Guoqiang Chai, Suzhou (CN); Yefeng Cai, Suzhou (CN); Yongsheng Mu, Suzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/101,147

(22) PCT Filed: Dec. 2, 2014

(86) PCT No.: PCT/CN2014/092820
§ 371 (c)(1),
(2) Date: Jun. 2, 2016

(87) PCT Pub. No.: WO2015/081853
PCT Pub. Date: Jun. 11, 2015

(65) Prior Publication Data
US 2016/0309274 A1  Oct. 20, 2016

(30) Foreign Application Priority Data
Dec. 2, 2013  (CN) .......................... 2013 1 0636558

(51) Int. Cl.
*H04S 5/00* (2006.01)
*G06F 3/16* (2006.01)
(Continued)

(52) U.S. Cl.
CPC .................. *H04S 5/00* (2013.01); *G06F 3/16* (2013.01); *H03F 3/183* (2013.01); *H03F 3/185* (2013.01);
(Continued)

(58) Field of Classification Search
CPC ... H04S 5/00; G06F 3/16; H03F 3/183; H03F 3/185; H03F 3/21; H03F 3/2175;
(Continued)

(56) References Cited

U.S. PATENT DOCUMENTS 6,215,423 B1 * 4/2001 May .................... H03H 17/0614
341/143
6,522,277 B2 * 2/2003 Fujimori ............. H03M 1/0665
341/118

(Continued)

FOREIGN PATENT DOCUMENTS

CN  103152673  6/2013
CN  103167380  6/2013
(Continued)

*Primary Examiner* — Sonia Gay
(74) *Attorney, Agent, or Firm* — Wayne Edward Ramage; Baker Donelson

(57) ABSTRACT

The present invention discloses an implementation method and a device of a multi-bit Δ-Σ modulation-based digital speaker system. The method comprises, 1) digital format converting; 2) oversampling interpolation filtering; 3) multi-bit Δ-Σ modulating; 4) thermometer coding; 5) multi-channel mismatch shaping; 6) coding format converting; 7) multi-channel digital power-amplifying; 8) driving a speaker array or a multiple voice coil speaker to sound. The device comprises: a digital input interface, an oversampling interpolation filter, a multi-bit Δ-Σ modulator, a thermometer coder, a multi-channel mismatch shaper, a coding format converter, a multi-channel digital power-amplifier, and a speaker array or a multiple voice coil speaker; each portion being connected in proper order. The present invention can (Continued)

achieve a high-power output under a low-voltage power supply, save power consumption, implement a single-chip integration of a multi-channel reproducing system, reduce the volume and weight of the system and the implementing cost, and improve the quality of the reproduced sound.

18 Claims, 18 Drawing Sheets

(51) Int. Cl.
H03F 3/183 (2006.01)
H03F 3/185 (2006.01)
H03F 3/21 (2006.01)
H03F 3/217 (2006.01)
H03F 3/68 (2006.01)
H03M 3/04 (2006.01)
H03M 3/00 (2006.01)
H04R 1/00 (2006.01)
H04R 3/04 (2006.01)
H04R 5/02 (2006.01)
H04R 5/04 (2006.01)

(52) U.S. Cl.
CPC ............ *H03F 3/21* (2013.01); *H03F 3/2175* (2013.01); *H03F 3/68* (2013.01); *H03M 3/04* (2013.01); *H03M 3/338* (2013.01); *H03M 3/508* (2013.01); *H04R 1/005* (2013.01); *H04R 3/04* (2013.01); *H04R 5/02* (2013.01); *H04R 5/04* (2013.01); *H03F 3/217* (2013.01); *H03F 2200/03* (2013.01); *H03F 2200/331* (2013.01); *H03M 3/424* (2013.01); *H04R 2201/403* (2013.01)

(58) Field of Classification Search
CPC ........ H03F 3/68; H03F 3/217; H03F 2200/03; H03F 2200/331; H03M 3/04; H03M 3/338; H03M 3/508; H03M 3/424; H04R 1/005; H04R 3/04; H04R 5/02; H04R 5/04; H04R 2201/403
See application file for complete search history.

(56) References Cited

U.S. PATENT DOCUMENTS

| | | | | |
|---|---|---|---|---|
| 6,531,973 B2* | 3/2003 | Brooks | ................ | H03M 3/502 341/118 |
| 6,577,261 B2* | 6/2003 | Brooks | ................ | H03M 1/067 341/118 |
| 6,628,218 B2* | 9/2003 | Brooks | ................ | H03M 1/067 341/143 |
| 6,771,199 B2* | 8/2004 | Brooks | ................ | H03M 1/067 341/118 |
| 6,816,097 B2* | 11/2004 | Brooks | ................ | H03M 3/502 341/143 |
| 6,930,626 B2* | 8/2005 | Brooks | ................ | H03M 1/067 341/118 |
| 6,950,049 B2* | 9/2005 | Brooks | ................ | H03M 3/502 341/118 |
| 7,777,658 B2* | 8/2010 | Nguyen | ................ | H03M 1/0663 341/143 |
| 8,306,244 B2* | 11/2012 | Okamura | ................ | H04R 1/005 381/111 |
| 8,423,165 B2* | 4/2013 | Yasuda | ................ | H03H 15/00 381/111 |
| 8,620,005 B2 | 12/2013 | Ma et al. | | |
| 9,219,960 B2* | 12/2015 | Yasuda | ................ | H04R 3/14 |
| 9,226,053 B2* | 12/2015 | Okamura | ................ | H04R 1/005 |
| 9,276,540 B2* | 3/2016 | Yasuda | ................ | H03H 15/00 |
| 9,300,258 B2 | 3/2016 | Ma | | |
| 9,544,691 B2* | 1/2017 | Yasuda | ................ | H04R 3/14 |
| 2002/0063647 A1* | 5/2002 | Brooks | ................ | H03M 1/067 341/144 |
| 2002/0080053 A1* | 6/2002 | Brooks | ................ | H03M 3/502 341/143 |
| 2003/0122692 A1* | 7/2003 | Roeckner | ................ | H03F 3/2175 341/53 |
| 2004/0233086 A1* | 11/2004 | Kiss | ................ | H03M 7/3042 341/143 |
| 2004/0252042 A1* | 12/2004 | Brooks | ................ | H03M 1/067 341/144 |
| 2005/0040979 A1* | 2/2005 | Brooks | ................ | H03M 3/502 341/144 |
| 2009/0110217 A1* | 4/2009 | Yasuda | ................ | H03H 15/00 381/120 |
| 2009/0243908 A1 | 10/2009 | Wagh | | |
| 2010/0239101 A1* | 9/2010 | Okamura | ................ | H04R 1/005 381/71.1 |
| 2011/0160883 A1* | 6/2011 | Yasuda | ................ | H04R 3/14 700/94 |
| 2012/0033837 A1* | 2/2012 | Mitsui | ................ | H04R 1/005 381/191 |
| 2013/0058497 A1* | 3/2013 | Okamura | ................ | H04R 1/005 381/94.1 |
| 2013/0156231 A1* | 6/2013 | Yasuda | ................ | H03H 15/00 381/120 |
| 2015/0310024 A1* | 10/2015 | Yasuda | ................ | H04R 3/14 700/94 |
| 2016/0205471 A1* | 7/2016 | Yasuda | ................ | H03H 15/00 381/100 |

FOREIGN PATENT DOCUMENTS

| | | |
|---|---|---|
| CN | 103701465 | 4/2014 |
| CN | 101986721 | 7/2014 |
| CN | 102684701 | 7/2014 |
| CN | 103152673 | 7/2015 |
| CN | 103167380 | 9/2015 |
| KR | 100671525 | 1/2007 |

* cited by examiner

IMPLEMENTATION METHOD AND DEVICE OF MULTI-BIT MODULATION-BASED DIGITAL SPEAKER SYSTEM

CROSS REFERENCE TO RELATED APPLICATIONS

This application is a § 371 National State Application of PCT/CN2014/092820 filed Dec. 2, 2014 which claims priority to CN 201310636558.4 filed Dec. 2, 2013, which are hereby incorporated by reference in their entirety.

TECHNICAL FIELD

The present invention relates to a speaker system implementation method and device in the field of sound reproduction, in particular to an implementation method and a device of a multi-bit Δ-Σ modulation-based digital speaker system.

BACKGROUND TECHNOLOGY

With the rapid development of manufacturing techniques for the super-large-scale integrated circuit, the trend for integrating and digitizing of electro-acoustical products has become increasingly evident, and the design and manufacture of the speaker system—as leading products of the electro-acoustic industry, gradually develop towards a direction of a low power consumption, miniaturization and portable type. Reviewing the development process of speaker systems, it can be divided into three stages: the analog speaker system, the semi-digital speaker system and the digital speaker system. The traditional analog speaker system has been no longer welcomed by the broad consumers due to the problems such as the low electro-acoustic conversion efficiency, high power consumption and heat, and the large volume and weight and the like; on the contrary, in recent years, the semi-digital speaker system generated by the digitization wave driving, because of to the use of pulse width modulation (PWM) or Δ-Σ modulation (Delta-Sigma modulation) and Class D power amplifying drive technology, successfully resolves the problem of power consumption and heat, greatly enhances the electro-acoustic conversion efficiency of the entire system, and accordingly can achieve a miniaturization level, which prompts the wide use of the semi-digital speaker system in the multimedia sound boxes, mobile phones, mp3 players, digital cameras and laptop computers and other fields. However, the backward stage of the semi-level digital speaker system still needs to rely on a bulky LC low-pass analog filter to filter the out-of-band high frequency component of the digital pulse modulated signal off, to demodulate the modulated low-frequency envelope signal, and thereby to complete the digital-analog conversion process. These semi-digital speaker systems have promoted the digitalization of the system to a power-amplifying stage, however, between the power amplifier and the speaker unit, it usually needs to rely on an analog low-pass filter consisting of inducers and capacitors to complete a digital-to-analog conversion, so as to ensure the speaker unit is in an analog input state; in addition, on the current market, many chip companies has launched digital power amplifier chips without analog low-pass LC filters, but these power amplifier chips do not consider an uniformly digital encoding processing by taking multiple speaker units or multiple voice coils as an entirety, and have a low performance and a limited suppression ability in terms of noise and harmonic distortion suppression, and meanwhile these power amplifier chips are restricted to drive a small-caliber speaker unit of a few watts order; for digitization driving of high-power speaker units, it still can not get rid of restrictions of the analog LC filter.

In order to eliminate the restrictions of the analog LC filter, to breakthrough the digitization bottleneck of speaker units, to improve the integration level of the speaker systems, to achieve a complete digitization of all signal processing and transmission steps in a speaker system, it is required to include the speaker unit into the digital coding step, to really achieve digitized coding of the speaker unit, to form a digitized speaker system, and thereby ultimately due to the low-pass filtering characteristic of the speaker unit and the human ear structure, converting from a digital coding vector to an analog vibration vector is completed, the digital-to-analog conversion step is transferred to be achieved in a physical stage of electro-acoustic transducing, and thereby a digital-to-analog conversion device included by a conventional system is taken away, and a variety of electrical noises introduced by digital-to-analog converter are avoided.

The digital to analog conversion process of the digital speaker system no longer relys on the traditional digital-analog converter chip to achieve, instead by means of the actual physical role of the speaker unit itself in the electro-acoustic conversion process to complete the digital to analog conversion. The speaker loads used by the digital systems usually are two kinds: Digital Speaker Array (DLA) and Multiple Voice Coil Digital Loudspeaker (MVCDL). For the case of DLA load, the digital-analog conversion process is as follow: firstly, each speaker unit independently completes the electro-acoustic conversion—converting a switch electrical signal sent by digital coding into an analog sound signal and independently radiating it into the air, and the electro-acoustic conversion process of each speaker unit is similar to the low-pass filtering, the speaker units also filtering process quantizing noise during the independent filtering process of the digitally coded signal; and then analog sound fields independently radiated by each unit complete a coupled superposition in the air, and thus the analog signal source component is accurately synthesized on the basis of ensuring the cancellation of the analog quantizing noise components radiated by each units. For the case of MVCDL load, the digital-analog conversion process is as follow: firstly, in the process of each winding receiving a digital current signal from the digitally coder, power conversion can occur independently, to convert the digital current signal into an electromagnetic driving signal in the pulse form for driving each windings; and multiple voice coils within the constraints of the binding action itself will coupling superimpose the electromagnetic driving component in the pulse form forced on itself, to form an electromagnetic driving resultant force in an analog form for driving a plurality of windings and the cone to move, thereby promoting the air to vibrate and reproduce an analog sound field. In both load cases, the reproduced analog sound field can be further improved through the low-pass filtering effect of human ear. Centred on the core issue of digitalization of the speaker unit, in recent years, scholars of a number of domestic and overseas research institutions have undertaken relatively wide and deep theoretical and practical researches on digitizing coded modulation technology, digitizing power drive technology and digitizing speaker unit manufacturing technology, and therefore forming a new research field of which the research direction is digitized speaker system design.

Since 1920s, experts and scholars of a number of foreign research institutions carried out theoretical and experimental researches on digital speaker system in succession, and have gained a fruitful research results. These studies mainly embodied on an innovative research of three core technologies, digitalized coding modulation technology, digitalized power amplifying technology and digitalized speaker manufacturing technology. According to the different digital coding systems, the digital speaker systems can be divided into three categories: PCM (Pulse Code Mouldation) coding-based digital speaker systems, 1-bit PWM (Pulse Width Mouldation) coding-based or Δ-Σ (Delta-Sigma Mouldation-DSM) coding-based digital speaker systems, and multi-bit Δ-Σ coding-based digital speaker system.

In 1963, C. Roberts filed the world's first invention patent (U.S. Pat. No. 3,153,229) of a PCM coding-based digital exciter. In 1979, Flanagan put forward a digitalization design on an electret speaker as well as an associated design method of an acoustic low-pass filter facing the application requirement of phones and headsets (J. L. Flanagan. Direct digital conversion in acoustic transducers [J]. J. Acoust. Soc. Am. Suppl. 1, 1979, 66: S54.). In 1977, the Japanese company SONY produced the world's first digital multiple voice coil speaker by a design method of controlling the number of turns of each windings units to increase according to a multiple of an exponential of 2, and developed an associated driving device (Patent No. JP 52121316). In 1986, Nieuwendi jk et from U.S. company PHILIPS improved the winding method of voice coils of the multiple voice coil speaker presented by SONY Corporation in early, and proposed that under the condition of maintaining the same number of turns of each voice coil, to manufacture each voice coil units by successively increasing the numbers of the winded wires of each voice coil according to a multiple of an exponential of 2, and winding a plurality of wires in parallel (U.S. Pat. No. 4,612,421).

These PCM coding-based digital loudspeaker system, mainly focusing on changing the load structure of the speaker to meet the digitalization requirements—designing the radiation area of each vibration unit or the winding turn number of each windings to keep a relationship of a multiple of an exponential of 2, the critical defect existing in the design idea is that simply relying on the increase of vibration unit area or the number of turns of coils to achieve digital system, will cause an increased weight of vibration components, a decreased speaker sensitivity, an enlarged power amplifier driving power, and a reduced electro-acoustic conversion efficiency; increased difficulty and cost in fabrication of components, a decreased speaker yield; a large volume and high weight of the speaker and the power amplifier which is difficult to meet the demand of portability. With the rapid development of electronic technology, started from 1997, Kishigami et al. from Japanese company SONY (U.S. Pat. No. 5,862,237) and Ken ji, et al. from Shinshu University (A. Hayama and the K. Furihata. Acoustic characteristics of an electrodynamic planar digital loudspeaker using noise shaping technology [J]. J. Acoust. Soc. Am., 2005, 117 (6): 3636-3644) began to focus on another way to realize the digital system—controlling the drive current of the power amplifying circuit of each vibration unit (the plate electrode, the piezoelectric patch or the voice coil) to increase according to a relationship of a multiple of an exponential of 2, considering the design of digital loudspeakers from the angle of the digitalization of the power amplifier driving circuit, and thus making up for the design defect of the speaker unit digitalization.

The PCM coding-based digital system requires to correspondingly structurally design the speaker diaphragm area or the number of turns of the voice coil or control the magnitude of the power amplifier driving current in combination with the place value of code, so as to ensure the synthesized analog signals of multiple bits has a good reproduction quality, it significantly increases the design complexity of the speaker or power amplifier, due to that it is hard to precisely control the scaling relation and the values of the diaphragm area, the number of turns of the voice coils and the power amplifier current, accordingly resulting in that it is hard to obtain a well reproduction effect for the PCM coding-based digital system.

The difficult problem existing in the PCM coding-based digital loudspeaker system is that it is difficult to accurately control the manufacture of the digital speaker unit and the drive current strength, and due to the constraints of the above mentioned problem, the PCM coding-based digital system has not been able to obtain a satisfactory level of sound quality. In order to overcome the defects and shortcomings of the PCM coding in the manufacture and the drive control of the digital loudspeaker system, in recent years, many scholars began to study the digital loudspeaker systems employing the 1-bit PWM or Δ-Σ modulation technology, and achieve a series of important research results.

Since 1994, the development team from UK company 1 LIMITED led by their president Doctor Tony Hooley, applied for a series of patents related to 1-bit PWM coded digital loudspeaker system (Patents WO 01/23104 A2 and GB 2373956 A). The realization method of this PWM technology based digital loudspeaker system has two shortcomings: D coding method based on the PWM technology, due to the modulation structure itself has an inherent nonlinear defect, will cause the coded signal to generate a nonlinear distortion component in the desired frequency band, and if further improved by using a linearization mean, the implementation difficulty and complexity of the modulation mode thereof will greatly increase. □ In consideration of the difficulty of hardware implementation, the oversampling frequency of the PWM mode itself is relatively low, and generally in a frequency range of 200 kHz~400 kHz, which will limit the signal to noise ratio of the coded signal to be further improved due to the oversampling rate.

With the advent of the new generation of ultra wideband digital coded sound source—SACD (Super Audio CD), the PWM coding-based digital power amplifier has been unable to meet the flat frequency response of 2 Hz~100 kHz required by this digital sound source. In order to ensure the high fidelity reproduction effect of SACD, many experts, scholars and engineers began to develop digital loudspeaker system based on 1-bit Δ-Σ coding, and expected to push the system quantization noise power to a out-band high frequency region by oversampling and noise shaping technology used by Δ-Σ modulation, to improve the tone quality level of the digital system. After many years of research and development accumulation, Japanese company SHARP successfully broke through the technology bottleneck of 1-bit digital amplifier, and since 1998, widely pushed out a series of 1-bit Δ-Σ coding-based digital loudspeaker products one after another in a plurality of acoustic consumption fields.

These 1-bit Δ-Σ coding-based digital loudspeaker systems, only need a simple low-pass filter to complete the digital-to-analog conversion, simple in hardware implementation; the system transfers the noise within an expected audio band to the high frequency region through a high speed switching rate and a 7-order Δ-Σ modulator, to ensure a high fidelity reproduction quality. The 1-bit Δ-Σ coding-based digital loudspeaker system, has the many advantages and meanwhile itself also has the following shortcomings: ☐ sensitive to the clock jitter, easy to introduce a nonlinear distortion due to the clock jitter; ☐ in order to maintain the stability of the modulation structure, allowing a very small dynamic range of the input signal; ☐ requiring a high on-off switching rate, while the power MOSFET transistor will generate many nonlinear distortion components in the process of driving the loudspeaker load to on-off switch in high speed, which also will cause the increased heat, the rised temperature and reduced efficiency of the MOSFET transistor.

In order to solve the defects existing in the 1-bit Δ-Σ coding-based digital loudspeaker system, many scholars turned to research on the multi-bit Δ-Σ coding-based digital systems. The multi-bit Δ-Σ modulation technology overcomes the shortcomings existing in the 1-bit Δ-Σ modulation, meanwhile itself also has a fatal defect—the modulation structure has a high sensitivity to the inconsistency between the frequency responses of the plurality of speaker units (or voice coil units), as well as the separation degree of the spatial locations of the plurality of speaker units, and is easy to introduce a larger coding error due to the inconsistency of the frequency responses of the plurality of unit or the separation of the spatial locations. In addition, the digital power amplifier circuit is easy to be affected by a significant power turbulent wave and fast switching rate effect and to introduce a large nonlinear distortion.

In order to overcome the deviation sensitivity defect of the multi-bit Δ-Σ modulation technology, since 1997, Professor Yasuda Shiaki from Japanese Hosei University and Engineer Okamura Jun from TRIGENCE SEMICONDUCTOR have been cooperating in the development of the multi-bit Δ-Σ coding-based digital system, and proposed a correction method of the system deviation (deviations of the frequency response and the spatial location) based on dynamically mismatch shaping and a beam steering method of a digitalized array based on delay adjustment, and collectively called the Δ-Σ modulation and the dynamic mismatch technologies used by the system as "Dnote" technology; they encapsulated the implementation circuit of "Dnote" technology into an IC chip—"Dnote" chip, and utilized the "Dnote" sample chip to produce a variety of digital loudspeaker system prototype—an 8-unit piezoelectric type linear array loudspeaker system, a 7-unit piezoelectric type ring array system and a 6-voice coil loudspeaker system, which were exhibited in the 2008 Digital Audio Visual Exhibition, and these systems can be driven by a low voltage of 1.5V, without a power amplifier and a LC filter, and has the ability to control the direction. In addition, Mitsui Akihito and Yamada Nobuhito from Janpanese MITSUBISHI COMPANY also filed a patent application (Patent No.: CN 102422650 A) for a Δ-Σ modulation digital loudspeaker on Mar. 10, 2010.

Patent CN102647191 A concerning the "Dnote" technology uses an analog FIR filter and a post-filter, these filters are implemented by employing a switched capacitor filter to achieve; these switched capacitor-based analog filters, are easily affected by external environment, have problems such as voltage drift, temperature drift and noise, and are difficult to achieve a high degree of stability and accuracy.

The drive circuit (or the switching amplifier) mentioned in Patents CN101803401 A, CN 102684700 A, CN 102239706 A, and CN102647191 A concerning "Dnote" technology and Patent CN 102422650 A applied by MITSUBISHI COMPANY, conducts switching operation according to the PDM (Pulse Density Modulation) coding-based digital signal obtained after the treatment of Δ-Σ modulation and mismatch shaping, and moreover, in order to achieve a higher level of signal to noise ratio (SNR), the on-off switching rate of the digital signal processed by Δ-Σ modulating and mismatch shaping is often very high, and is generally required to be more than 10 MHz, for achieving an ideal SNR level, for example, with a 12.5 MHz on-off switching rate, the SNR can reach a level of 100 dB. The over-high on-off switching rate cause a severe decrease of the efficiency of the driving circuit, and meanwhile the over-high switching rate brings an instability into the drive circuit in a slightly higher output power condition, resulting in the driving circuit can not work normally, and for ensuring the stability of the drive circuit in a high speed switching condition, it needs to strictly limit the output power of the drive circuit, and generally for keeping the on-off switching rate of the driving circuit to meet a magnitude order of 10 MHz, the output power of the drive circuit is needed to be limited to a magnitude order of 1 W to ensure the SNR and the harmonic distortion of the driving circuit reach ideal levels, and to keep a steady work of the drive circuit. The drive circuit referred in these patents can not achieve a high power output due to the high speed on-off switching rate limit, and can only be limited to the power output level of 1 W magnitude order.

The mismatch shaping referred in Patents CN101803401 A, CN 102684700 A, CN 102239706 A, and CN102647191 A concerning "Dnote" technology and Patent CN 102422650 A applied by MITSUBISHI COMPANY, does not consider that the input signal amplitude is directly related to the number of the mismatch shaping channel, and does not optimize the channel number participating in mismatch shaping according to the input amplitude of the signal. This defect will cause all channels of the mismatch shaper take part in shaping processing, and consume more energy, and there is optimizing space in reducing the power consumption. The mismatch shaping referred in these patents does not consider the improvement of the SNR brought by increasing the shaping order and optimizing the zero-pole of the shaper.

Patent CN101409560 A mentions that the multiple formats of serial audio signal received from pins of SDATA, BCLK, and LRCK, after serial-to-parallel conversion, are sent to a de-emphasis/interpolation filter, a multi-bit Σ-Δ regulator (DSM), and a dynamic element matching unit (DEM) for combined processing, such that the input data with a high resolution (typically 16 bits to 24 bits) and a low sampling rate (typically 8 KHz to 200 KHz) is transformed into a digital signal with a low resolution (typically 1 bits to 6 bits) and a high sampling frequency (typically 32 times to 128 times of the input frequency); and then the digital signal with a low resolution and a high sampling frequency is transformed by a low pass filter SCF into an analog signal and sent to a sound mixer, by which the analog audio signal output by the digital-to-analog converter is mixed with other analog audio signal, and finally the analog audio signal output by the sound mixer is power amplified, to drive an external headset or speaker to sound. The de-emphasis/interpolation filter, the multi-bit Σ-Δ regulator (DSM), the dynamic element matching unit (DEM) and the low pass filter SCF mentioned in Patent CN101409560 A are typical in the signal processing of a digital-to-analog converter, and this working process does not involve in coding and distribution process directed at multiple units of the loudspeaker array or the multiple voice coil speakers, only processes the input serial audio digital signal digital by digital-to-analog converting to obtain an analog audio output signal, which is sent to a power amplifier and then the amplified signal drives the speaker unit or the headset to sound. The process from power amplifying to outputting of the speaker still belongs to the analog signal transmission process, and the system consisting of the power amplifier and the electro-acoustic transducer of the loudspeaker has a relatively low degree of the integration and relatively low electro-acoustic conversion efficiency, without considering an uniformly digital coding process by taking the multiple speaker units of the speaker array or the multiple voice coils of the multiple voice coil speaker as an entirety.

Aimed at the defects existing in the current digital loudspeaker system devices, and combined with the requirements of low power consumption, small outline, and digitalization and integration development, it is thus desired to find a signal modulation and coding decoding manner with excellent performances and simple implementation, to achieve a digital loudspeaker system device of excellent performances.

SUMMARY

The present invention is aimed at overcoming the defects existing in the current digital loudspeaker system devices, and combining with the requirements of low power consumption, small outline, and digitalization and integration development, presents an implementation method and device of a multi-bit Δ-Σ modulation-based digital speaker system.

To achieve the above-mentioned aims, the present invention employs the following technical schemes;

An implementation method of a multi-bit Δ-Σ modulation-based digital speaker system, comprises the following steps, 1) converting an input sound source file by digital format converting, to generate a PCM coded signal with a bit width N and a sampling frequency $f_o$;

2) filtering the PCM coded signal with the bit width N and the sampling frequency $f_o$ by oversampling interpolation filtering according to a specified oversampling rate $O_{SR}$, to obtain a PCM coded signal with a bit width N and a sampling frequency $f_{osr}=O_{SR} \times f_o$;

3) multi-bit Δ-Σ modulating the PCM coded signal with the bit width N and the sampling frequency $f_{osr}=O_{SR} \times f_o$, to generate a PCM coded signal with a bit width M and a sampling frequency $f_{osr}$, wherein M<N;

4) thermometer-coding the PCM coded signal with the bit width M and the sampling frequency $f_{osr}$, to convert it to a parallel binary coded signal with a sampling frequency $f_{osr}$ and corresponding to $2^M$ digital channels of digital power amplifiers and speaker loads;

5) multichannel mismatch shaping, employing a input signal amplitude optimization-based dynamic element mismatched shaping algorithm—ISAO-DEM shaping algorithm in the algorithm implementation, the ISAO-DEM shaping algorithm dynamically adjusts the number of channels participating in mismatch shaping according to the amplitude of an input signal, and disposes the rest channels not participating in shaping to close or sleep, and the ISAO-DEM shaping algorithm adjusts the output sequence of a parallel coded stream generated from the binary coded signal with the sampling frequency $f_{osr}$ and corresponding to $2^M$ digital channels by a certain random sorting method, to randomly select output channels;

6) converting the binary coded signal with the sampling frequency $f_{osr}$ and corresponding to $2^M$ digital channels by coding format converting, to a 1-bit PWM coded data stream with a sampling frequency $f_{dsr}=f_{osr}/D_{SR}$ and corresponding to $2^M$ channels, wherein $D_{SR}>1$;

7) digital power amplifying the 1-bit PWM coded data stream with the sampling frequency $f_{dsr}=f_{osr}/D_{SR}$ and corresponding to $2^M$ channels, to generate a power amplified digital switch electrical signal;

8) multiple speaker units in a speaker array or multiple voice coils in a multiple voice coil speaker cooperating to complete a sonic-electric conversion, to convert the digital switch electrical signal to an analog sound signal.

Preferably, when the input sound source file has an analog format, the format converting manner of the input sound source file is: converting the sound source file by analog-digital converting, into a PCM coded format based digital signal, which then being converted, according to a system specified sampling frequency $f_o$ (typically 44.1 KHz to 192 KHz) and a specified bit width N (typically 16 bits to 24 bits), into a PCM coded signal;

or when the input sound source file has a digital format, the format converting manner of the input sound source file is: converting the sound source file, according to a system specified sampling frequency $f_o$ and a specified bit width N, into a PCM coded signal.

Furthermore, the oversampling interpolation filtering in the step 2), as shown in FIG. 2, is achieved by completely employing a digital circuit, generating an oversampled digital signal with a specified oversampling rate $O_{SR}$ by a multiplied cascaded structure of a FIR (Finite Impulse Response) interpolation filter structure and a CIC (Cascaded Integrator Comb) interpolation filter, the signal having a sampling frequency $f_{osr}=O_{SR} \times f_o$ and a bit width N. The FIR interpolation filter is only used in the case of small oversampling rate $O_{SR}$ and low oversampling frequency, and in the case of higher sampling frequency, the multiply add operation of the FIR interpolation filter requires a over high clock frequency, and causes a over large hardware resource consumption, and therefore in the case of higher oversampling rate $O_{SR}$ and oversampling frequency, the CIC interpolation filter is employed to save the hardware resource consumption. Preferably, the oversampling interpolation filtering in the step 2), except that the CIC interpolation filter is employed in the last stage, is implemented by employing the FIR interpolation filter in each of the previous other stages. As shown in FIG. 3, the coefficients of the FIR filter need to be designed according to parameters such as the oversampling rate, the corner frequency, the amplitude fluctuation of the in-band frequency response, the amplitude decrement of the out-band frequency response and the like. As shown in FIG. 4, the CIC filter is consisted of a comb filter and a integrating filter, and achieves the interpolation filtering processing by multiplied cascade of the comb filter and the integrating filter.

In the above-mentioned technical scheme, further, the multi-bit Δ-Σ modulation in Step 3) is to convert the high bit-width PCM coded signal with the sampling frequency $f_{osr}$ and the bit width N, into a low bit-width PCM coded signal with a sampling frequency $f_{osr}$ and a bit width M(M<N). As shown in FIG. 5, the process of the multi-bit Δ-Σ modulation is as follow:

assuming a quantized noise e(n) obeys the white noise distribution characteristics, in the case of being excited to u(n) the z domain formula of the system output v(n) can be deduced as:

$$V(z) = \frac{H(z)}{1+H(z)}U(z) + \frac{1}{1+H(z)}E(z) \quad (1)$$
$$= STF(z)U(z) + NTF(z)E(z)$$

wherein $$STF(z) = \frac{H(z)}{1+H(z)}$$

is a signal transfer function, and $$NTF(z) = \frac{1}{1+H(z)}$$

is a noise transfer function.

It can be known according to Formula (1) that, the design criterion of the multi-bit Δ-Σ modulation is, under the premise of maintaining the distortionless transmission of the signal, pushing as many noise spectrum energy within audio frequency band as possible to the out-band high frequency region, therefore, under the premise of maintaining STF(z)=1, the design problem of the multi-bit Δ-Σ modulation is turned to be the zero-pole design problem of the noise transfer function NTF(z).

The advantage of the Δ-Σ modulation is reducing the number of quantized bits and meanwhile lowering the in-band quantized noise power, wherein two approaches for lowering the in-band quantized noise power are: oversampling and noise shaping, however, if simply increasing the sampling frequency without noise shaping, each doubling of the sampling rate, increases the SNR only by 3 dB, for this reason, by merely relying on the oversampling method to lower the noise power, the improvement effect is very limited. For further lowering the noise power, it needs to introduce the noise shaping method, utilizing the high pass characteristic of the Noise Transfer Function (NTF), transferring the low frequency quantized noise to the out-band high frequency region, to ensure that the SNR within the low frequency band meets the design requirements. The in-band noise decrement of the NTF is related to the used order, and assuming the order of the NTF is L, the formula thereof is:

$$NTF(z) = (1 - z^{-1})^L \quad (2)$$

It can be known according to Formula (2) that, for first order NTF, each doubling of the sampling rate, increases the SNR by 9 dB, and for fifth order NTF, each doubling of the sampling rate, increases the SNR by 33 dB, which is much higher than the obtained SNR by merely increasing the sampling rate.

In practical applications, due to the limitation of stability, the NTF order will not infinitely increase. In order to improve the system operation stability, it is usually considered that increasing the number of bits of the quantizer in the case of a fixed NTF order, however, the increase of the number of bits will require the feedback loop to contain more DAC elements. Due to that there is a certain matching error between multiple DAC units, these unit deviation will introduce a non-linear distortion component, resulting in the reduce of the system overall SNR; while a 1-bit quantizer does not has non-linear error, and can obtain very high linearity, but has a lower input dynamic range due to the restrict of the stability.

The implementation structures for a high order Δ-Σ modulator are divided into two type, a single loop high order type and a multi-stage high order type. The single loop high order modulators are divided into four kinds of structures, CIFB (Cascaded integrators with distributed feedback as well as distributed input coupling), CRFB (Cascade of resonators with distributed feedback), CIFF (Cascaded integrators with distributed feedforward as well as distributed input coupling) and CRFF (Cascade of resonators with feedforward and input coupling), wherein in the single loop high order modulators the CIFB structure is the most widely used. The implementation circuit of the single loop high order modulator is simple but has a poor stability; the implementation circuit of the multi-stage high order modulator is complicated, and has an interstage noise leakage problem.

One implementation approach of the multi-bit Δ-Σ modulation is: a 5th-order Δ-Σ modulator based on the CIFB structure, the signal process flow chart thereof being shown in FIG. 6, and advantages of this structure are as follow: if $a_i = b_i (1 \leq i \leq 5)$, this system only processes the noise signal without processing the input signal, possessing an excellent linear characteristic; meanwhile the integrator only process the error, largely increasing the dynamic range. According to the signal process flow of FIG. 6, the formulas of the signal transfer function and the noise transfer function can be deduced as follow:

$$STF(z) = \frac{b_6(z-1)^5 + c_5b_5(z-1)^4 + c_5c_4b_4(z-1)^3 +}{(z-1)^5 + c_5a_5(z-1)^4 + c_5c_4a_4(z-1)^3 +} \\ \frac{c_5c_4c_3b_3(z-1)^2 + c_5c_4c_3c_2b_2(z-1) + c_5c_4c_3c_2c_1b_1}{c_5c_4c_3a_3(z-1)^2 + c_5c_4c_3c_2a_2(z-1) + c_5c_4c_3c_2c_1a_1} \quad (3)$$

$$NTF(z) = \frac{(z-1)^5}{(z-1)^5 + c_5a_5(z-1)^4 + c_5c_4a_4(z-1)^3 +} \\ c_5c_4c_3a_3(z-1)^2 + c_5c_4c_3c_2a_2(z-1) + \\ c_5c_4c_3c_2c_1a_1 \quad (4)$$

in order to ensure the distortionless transmission of the signal, STF(z)=1 is required, it can be deduced that:

$$b_6 = 1, b_i = a_i, (i = 1, 2, 3, 4, 5) \quad (5)$$

Setting the value of NTF(−1) according to the stability conditions of the Δ-Σ modulator, the zero-pole of the NTF and the coefficient value of the transfer function can be calculated. In practical applications, in order to save the multiplying unit resource, the coefficient is required to be decomposed by CSD (Canonic Signed-Digit) to obtain the quantized values thereof.

In the above-mentioned technical schemes, further, the thermometer-coding in Step 4), is to convert the PCM coded signal with the bit width M into a binary coded signal corresponding to $2^M$ channels of digital power amplifiers and speaker loads (a speaker array or a multiple voice coil speaker), and the binary coded signal corresponding to each channel, has only two electric level states "0" and "1" at any time, when in the "0" state, the speaker load is switched off, and when in the "1" state, the speaker load is switched on. coding distribution for the multi-channel speaker load is achieved by the thermometer-coding, and thus the speaker load is included into the signal coding process, completing the digitalized coding and digital switched control for each array element in the speaker array or each voice coil of the multiple voice coil speaker. As shown in FIG. 7, when the 3-bit PCM code generated by Δ-Σ modulation is "001", the thermometer code converted from it is "00000001", which is to control one array element or one voice coil in the speaker array or in the multiple voice coil speaker to switch on, and the other 7 array elements or 7 voice coils to switch off; when the 3-bit PCM code generated by Δ-Σ modulation is "100", the thermometer code converted from it is "00001111", which is to control 4 array elements or 4 voice coils in the speaker array or in the multiple voice coil speaker to switch on, and the other 4 array elements or 4 voice coils to switch off; when the 3-bit PCM code generated by Δ-Σ modulation is "111", the thermometer code converted from it is "01111111", which is to control 7 array elements or 7 voice coils in the speaker array or in the multiple voice coil speaker to switch on, and the left one array element or one voice coil to switch off.

In the above-mentioned technical schemes, further, in the multichannel mismatch shaping in Step 5), as shown in FIG. 8, the signal processing process is as follow: firstly, the Δ-Σ modulator reduces the PCM coded signal with a word length N to a PCM coded signal with a short word length (M bits, M<N); then, the thermometer coder converts the M-bit single-channel PCM code into a 1-bit parallel output coded stream corresponding to $2^M$ transmission channels, these parallel output coded stream is required to be processed by multichannel mismatch shaping before entering the power amplifier, to eliminate non-linear distortion components of the synthesized signal caused by the frequency response deviation of the multiple output channels, and to improve the synthesis quality of the output signal of the array.

The multi-channel mismatch shaping adjusting the output order of the parallel coded vectors generated by the 1-bit parallel output coded stream of the $2^M$ transmission channels by means of a certain random sorting method, so as to achieve the effect of randomly selecting the output channel; based on the method of randomly selecting channels to broadcast the coded sequence, the non-linear distortion deviation components of the synthesized signal caused by the channel deviations, is whitening processed, and the harmonic power thereof at specific frequency is dispersed to the entire frequency band so as to be translated to noise components, which eliminates the non-linear distortion of the synthesized signal introduced by the harmonic components.

The multichannel mismatch shaping, may employ three common mismatch shaping algorithms, DWA (Data-Weighted Averaging) algorithm, a second order VFMS (Vector-Feedback mismatch-shaping) algorithm, and a second order TSMS (Tree-Structure mismatch shaping) algorithm, wherein the DWA algorithm has a worst property, and the shaped frequency spectrum still has an obvious harmonic component at high frequency; the second order TSMS algorithm has a better shaping effect than the DWA algorithm, but a worse noise suppression ability than the second order VFMS algorithm; the second order VFMS algorithm has the best shaping effect.

Due to the second order VFMS algorithm has the best shaping effect, and considering the attenuation and suppression abilities on the noise and the harmonic wave will be enhanced with the order of the VFMS increasing, in order to improve the attenuation and suppression abilities on the noise and the harmonic wave, the attenuation and suppression abilities on the noise of the second order VFMS algorithm may be further optimized and improved, as shown in FIG. 9, a third-order VFMS mismatch shaping algorithm may be employed, wherein the shaping function (MTF-1) uses a third-order VFMS mismatch shaping structure, the formula thereof is as follow:

$$\frac{(z-1) \cdot (z^2 - 1.994z + 1)}{(z-0.6685) \cdot (z^2 - 1.529z + 0.6629)} \quad (6)$$

the coefficient design of the functions contained in the formula (6), requires to find the optimized zero pole location and the system parameter structure relying on repeated simulation and measurement experiments, to ensure the stability of the system. Compared with the second order VFMS algorithm, the third-order VFMS mismatch shaping algorithm can achieve a 16 dB SNR improvement.

The multi-channel mismatch shaping, utilizes an input signal amplitude optimization-based DEM shaping algorithm, ISAO-DEM (Input Signal Amplitude Optimization-Dynamic Element Mismatched) shaping algorithm, in algorithm implementation. The algorithm dynamically adjusts the number of channels participating in mismatch shaping according to the amplitude of an input signal, and disposing the rest channels not participating in shaping to close or sleep. This DEM method of dynamically managing the hardware resources according to the input signal amplitude, may save the hardware resources occupied by the algorithm, and save power consumption of the hardware.

The ISAO-DEM shaping algorithm can select the channels participating in mismatch shaping by a state control module according to the input signal amplitude, in this way, when the input signal amplitude is small, the state control module may select part of the channels to participate in mismatch shaping and disposes the rest channels not participating in shaping to close or sleep; only when the input signal amplitude is large than the set threshold value, the state control module may switch on all the channels to participate in mismatch shaping. The algorithm can dynamically adjust the number of channels participating in mismatch shaping according to the amplitude of an input signal, in this way, it is possible to dynamically manage the hardware resources occupied by the shaping algorithm, to save the hardware resource overhead of the algorithm, and to save the circuit power consumption of the system.

FIG. 10 shows the signal processing flow chart when the ISAO-DEM algorithm in a 8-channel shaping processing, wherein, the input signal of the ISAO-DEM algorithm module is v(n), the value is any value in a set {0,1,2,3,4,5,6,7,8}, and meanwhile v(n) also corresponds to an output of the SDM module, and the output of the ISAO-DEM algorithm module is $x(n)=[x_1(n), x_2(n), \ldots, x_8(n)]$, the x(n) is directly sent to the input of the digital power amplifier, and these power amplified digital coded signals will drive the speaker to conduct sound radiation. x(n) value is obtained by comparing and sorting v(n) and the value $(y)n=[y_1(n), y_2(n), \ldots, y_8(n)]$ by a selector module. The implementation process of the selector module is as follow: the selector module sorts the elements in y(n) vectors in the order from big to small, and after the sorting, the selector module selects v(n) elements previous to the vector after sorting in the order from big to small, and fetches the index numbers of these selected elements, and according to the fetched index numbers, sets the elements $x_i(n)$ with the same index number to be 1, and the left elements in vector x(n) will be set to be 0. For example, assuming at present the v(n) value is 4, the value y(n) is [9, 5, 6, 4, 3, 7, 8,1], and the vector after sorting is [9,8,7,6,5, 4, 3, 1], the previous 4 elements in the order from big to small are {9, 8, 7, 6}, the index numbers thereof are {1, 7, 6, 3}, then the elements $x_1(n)$, $x_7(n)$, $x_6(n)$ and $x_3(n)$ of the vector $x(n)$ corresponding to the selected index numbers are set to 1, and the other left elements in vector $x(n)$ are set to 0.

The ISAO-DEM algorithm utilizes a state control module to analyse the input signal amplitude, and according to the range of the input signal amplitude, selects channels to participate in mismatch shaping and disposes the rest channels not participating in shaping to sleep. For example, the state control module divides the input signal amplitude into three ranges, and processes the channels to participate in shaping in three cases according to these three ranges. When the normalized amplitude of the input signal is in an interval range [$\frac{1}{16}$, 1], all the channels are selected to participate in shaping; and when the normalized amplitude of the input signal is in an interval range [$\frac{1}{32}$, $\frac{1}{16}$], only the first, second, third and fourth channels are selected to participate in shaping, and the rest 4 channels sleep; when the normalized amplitude of the input signal is in an interval range [0, $\frac{1}{32}$], only the first and second channels are selected to participate in shaping, and the rest 6 channels sleep, in such way, it is possible to reduce the hardware resource overhead and decrease the system power consumption in the case of small signal input.

The multi-channel mismatch shaping, can control the speaker units (the speaker array load) or the speaker voice coils (the multi-voice coil speaker) to on-off switch by the ISAO-DEM shaping algorithm according to a principle that the harmonic distortion of the superpositioned sound field being whitened as far as possible, which ensures the harmonic distortion level of the reproduced sound field of the speaker array or the multi-voice coil speaker after the electro-acoustic conversion is as low as possible, and the sound quality level of the reproduced sound field is improved. FIG. 7 shows a schematic diagram of the on-off switch of each speaker unit or each voice coil after processed by the ISAO-DEM shaping algorithm. When the input code is "001", the shaper according to the past working log of each speaker unit or each voice coil participating in sound reproduction, selects Speaker 1 to participate in sound reproduction; when the input code is "100", the shaper according to the past working log of each speaker unit or each voice coil participating in sound reproduction, selects Speaker 1, Speaker 4, Speaker 5 and Speaker 7 to participate in sound reproduction; when the input code is "111", the shaper selects Speaker 1 to Speaker 7 to participate in sound reproduction. The ISAO-DEM shaping algorithm selects which speaker units or voice coils to participate in sound reproduction at present, according to the recorded past working times of each speaker unit or each voice coil participating in sound reproduction as well as the sound quality level of the synthesized sound field. The ISAO-DEM shaping algorithm may optimize and combine the speaker unit or the voice coil participating in sound reproduction, to ensure the total harmonic distortion of the reproduced sound field generated by the combined speaker units or voice coils is minimum. The ISAO-DEM shaping algorithm switching controls the speaker unit load or the voice coil load according to the principle of minimizing total harmonic distortion of the reproduced sound field, and ensures each speaker unit or each voice coil participates in sound reproduction according to a principle of equal probability, and ensures every speaker unit or every voice coil participates in sound reproduction in its own best response state, and thus ensures the sound quality level of the reproduced sound field. The working manner of controlling on-off switching of each speaker unit or each voice coil by the ISAO-DEM shaping algorithm, corresponds to whitening the total harmonic components of the reproduced sound field, and dispersing the harmonic power into the entire sound frequency band, and the whitened harmonic power presenting as noise format in the entire frequency band, reduces the harmonic distortion level, and improves the sound quality level of the reproduced sound.

The multi-channel mismatch shaping, controls the speaker units (the speaker array load) or the speaker voice coils (the multi-voice coil speaker) to be equalized used according to a clock tick by the ISAO-DEM shaping algorithm, which avoids each speaker unit or each speaker voice coil to be in a long-term overload running state, protects the normal use of the speaker array or the multi-voice coil speaker, and increases the service life of the speaker array or the multi-voice coil speaker. The ISAO-DEM shaping algorithm, can determine which channels the speaker units (the speaker array load) or the speaker voice coils (the multi-voice coil speaker) locate are needed to be set to 1, and can select and control the determined channels where the speaker units or the speaker voice coils locate to send code word "1" or "0", if the shaper sends a code word "1" to the channels where the speaker units or the speaker voice coils locate, the digital amplifier applies a source voltage Vcc on the speaker units or the speaker voice coils, and if the shaper sends a code word "0" to the channels where the speaker units or the speaker voice coils locate, the digital amplifier does not apply a voltage on the speaker units or the speaker voice coils, and the voltage received by the speaker units or the speaker voice coils is 0. The mismatch shaping-based drive manner of the speaker units or the speaker voice coils, can follow the control rules of the shaping algorithm that the harmonic distortion is whitened as far as possible and the channels are used as averaging as possible, to ensure the speaker units or the speaker voice coils participate in digital-to-analog conversion process according to a principle of an averaging probability and in the reproduction of the sound field according to an averaging probability of a clock tick, and the speaker units or the speaker voice coils are always in a working state in which the source voltage Vcc and no-voltage are alternatively switched, to avoid each speaker unit or each speaker voice coil to be in a long-term overload running state, protect the normal use of the speaker array or the multi-voice coil speaker, and thus increase the service life of the speaker array or the multi-voice coil speaker. In additional, this working manner of avoiding the overload of the speaker units or the speaker voice coils, also ensures every speaker unit or every voice coil participates in sound field reproduction in its own best response state, and thus ensures the reproduced sound field of the system is in the best sound quality level.

The multi-channel mismatch shaping, controls the speaker units (the speaker array load) or the speaker voice coils (the multi-voice coil speaker) to be equalized used according to a clock tick by the ISAO-DEM shaping algorithm, and this on-off switching mode based on a principle of equalized using the speaker units or the speaker voice coils, can obviously reduce the electric energy consumption level during the system works, and when compared with the traditional analog system, this on-off switching based digital system only has an electric energy consumption that is $\frac{1}{4}$ to $\frac{1}{8}$ of the traditional analog system, and possesses an obvious energy-saving characteristic. The digital reproducing system allocating, real-time managing and controlling the on-off switching of multiple speaker units or multiple speaker voice coils by dynamically coding, possesses an excellent energy-saving characteristic, and is especially suitable for portable consumption electronic products, and can obviously enhance the battery life of a battery and a product thereof.

In the above-mentioned technical schemes, further, the coding format converting in Step 6), is to convert the 1-bit data stream with an on-off switching rate $f_{osr}$ corresponding to $2^M$ channels obtained by multi-channel mismatch shaping, according to a coding converting manner of decreasing the switching rate, to lower the on-off switching rate by $D_{SR}$ times, and thus obtain a coded signal with an on-off switching rate of $f_{dsr}=f_{osr}/D_{SR}$ and corresponding to $2^M$ channels. After coding format converting, the original PDM (Pulse Density Modulation) coded signal with the over high on-off switching rate on each channel is converted into a coded signal with a relatively low on-off switching rate, and this coded signal with the relatively low on-off switching rate after amplified by a power MOSFET transistor can keep the abilities of harmonic suppression and channel deviation immunization of multi-bit Δ-Σ modulation and dynamic mismatch shaping processing, and meanwhile reduces the sharp glitch number and amplitude generated during the switching process of the power MOSFET transistor, and reduces the power loss during the switching process.

A preferred implementation manner of the coding format converting, is to convert the 1-bit data stream with an on-off switching rate $f_{osr}$ corresponding to $2^M$ channels, according to a coding converting manner from a PDM coding format to a PWM coding format, into a PWM coded data stream with an on-off switching rate of $f_{dsr}$ and corresponding to $2^M$ channels. As shown in FIG. 11, after coding format processing, the original PDM (Pulse Density Modulation) coded signal with the over high on-off switching rate on each channel is converted into a PWM coded signal with a relatively low on-off switching rate.

In the above-mentioned technical schemes, further, the multi-channel digital amplifying in the step 7), indicates that the coded signal with the relatively low on-off switching rate after the coding format converting on each data transmission channels, as well as the switch control signal forming a difference between the signal and an inversion signal thereof, are to control an on-off action of a full-bridge power amplifier circuit, the specific control process of the on-off action being shown as in FIG. 12. When the binary status codes "0" and "1" control the on-off action of the full-bridge power amplifier circuit, in the input cases of the two status, the on/off and the current flow directions of the four power MOSFET transistors are shown in FIG. 12, wherein "HA" and "LA" respectively are the labels of the high side and low side MOSFET transistors on side A; similarly, "HB" and "LB" respectively are the labels of the high side and low side MOSFET transistors on side B. When in inputting of "1" status, HA and LB are both turned on, and HB and LA are both turned off, then the current flows from the side A of the speaker unit to the side B, and the speaker unit bears a voltage "+Vcc"; similarly, When in inputting of "0" status, HB and LA are both turned on, and HA and LB are both turned off, then the current flows from the side B of the speaker unit to the side A, and the speaker unit bears a voltage "−Vcc".

In the above-mentioned technical schemes, further, driving the speaker array or the multiple voice coil speaker to sound in the step 8), in the driving and sounding processes the speaker load (the speaker array or the multiple voice coil speaker) has self-demodulating and self filtering characteristics, without relying on a traditional analog LC low-pass filter consisting of an analog inductor and a analog capacitor to conduct low-pass filtering demodulating process, rather than completing the low-pass filtering process by its own electro-acoustic conversion process of the speaker load; the self-demodulating and self filtering characteristics accompanying with its own physics conversion process of the speaker, omit power filter elements on multiple transmission channels—bulk and expensive inductors and capacitors, decrease the complexity of the hardware implementation, save the manufacturing cost of the hardware, and also save the volume and weight of the hardware device; meanwhile avoid the amplitude fluctuation of the frequency response of the reproduction system introduced by the frequency response of the filtering network of the inductor and the capacitor, and enhance the sound field reproducing quality of the reproduction system.

In the process of driving the speaker array or the multiple voice coil speaker to sound, the coded information received by the channels of each speaker unit or each voice coil only contains part of the coded information in the input sound source coded information, and the SNR of the reproduced signal recovered by filtering by the channels of each speaker unit or each voice coil is not high enough, and required to rely on a coherent superposition of the signals filtered by all channels of the speaker units or the voice coils to improve the SNR level. The work manner of this digital speaker device is entirely different from the work manner of the traditional speaker device in that, every speaker unit or every voice coil included in the traditional speaker device is an independent signal channel, and the signal received by each speaker unit or each voice coil contains all coded information of the input sound signal, and a single speaker unit or a single voice coil can independently complete the entire reproduction of the input sound resource information; while in the digital speaker device, a single speaker unit or a single voice coil cannot independently complete the entire reproduction of the input sound resource information, and has to rely on the cooperation between all speaker units or all single voice coils to complete the entire reproduction of the input sound resource information, and all speaker units or all single voice coils join up in essence to act as an independent virtual channel to complete the entire reproduction of the input sound resource information. This manner of completing the entire reproduction of the input sound resource information by relying on multiple speaker units or multiple speaker voice coils, is in essence a reproducing manner of obtaining spacial redundancy by means of increasing the speaker units or the speaker voice coils, and can obviously improve the sound quality level of the reproduced sound field; this sound reproduction system, is suitable for being applied to reproduction situation of presenting multiple musical instruments, multiple voice coils and complex background sound, and can significantly increase the isolation degree and hierarchy of each sound channel.

In the process of driving the speaker array or the multiple voice coil speaker to sound, multiple speaker units or multiple single voice coils join up and cooperate, to complete the entire reproduction of the input sound resource information, and this implementation manner of the sound reproduction system, provides an effective implementation approach of obtaining a large sound power output under the situation of low-voltage power supply. Although the sound pressure output provided by a single speaker unit or a single voice coil under the condition of low-voltage power supply is relatively limited, after the coherent superposition of the reproduced sound signals of multiple speaker units or multiple voice coils to achieve the desired sound pressure output level, this implementation manner of the sound reproduction system with multiple speaker units or multiple speaker voice coils is suitable for a situation of low-voltage power supply, and can significantly reduce the complexity of the power supply system and improve the reliability, and is easy to be popularized and applied in various application situations.

In the above-mentioned technical schemes, further, after several steps of signal process, oversampling interpolation filtering in Step 2) multi-bit Δ-Σ modulating in Step 3), thermometer coding in Step 4), multi-channel mismatch shaping in Step 5) and coding format converting in Step 6), an input conventional PCM coded signal with a low sampling rate and a high bit width can be directly converted into a digital coded signal with a low on-off switching rate and a 1-bit width and corresponding to multiple digital power amplifier channels. These signal processing process can be implemented in digital domain, and in such way, by means of chip designing and manufacturing, these signal processing process can be integrated into a very small chip packaging and completed, and multiple digital-to-analog conversion chip included in a traditional multi-channel sound reproduction system can be get rid of in the hardware implementation, accordingly saves the hardware implementation cost and the hardware space usage of the multi-channel sound reproduction system; meanwhile, this multi-channel signal processing chip with a high integration density, may also save the overhead of electric energy, is very suitable for use in a portable system powered by battery, and can significantly increase the battery life of a battery and a system. In addition, this digital sound reproduction system without digital-to-analog conversion, also avoids the quantizing noise introduced by the digital-to-analog conversion process, and thus ensures the digital sound reproduction system possesses a sound field reproduction performance of high fidelity.

A multi-bit Δ-Σ modulation-based digital speaker system device, as shown in FIG. 13, comprises:

a digital input interface (1) to convert an input sound source file into a system specified digital input format, to generate a PCM coded signal with a bit width N and a sampling frequency $f_o$;

an oversampling interpolation filter (2), connected with an output of the digital input interface (1), and to convert the PCM coded signal with the bit width N and the low sampling frequency $f_o$, according to a specified oversampling rate $O_{SR}$, into a PCM coded signal with a bit width N and a high sampling frequency $f_{osr}=O_{SR} \times f_o$;

a multi-bit Δ-Σ modulator (3), connected with an output of the oversampling interpolation filter (2), and to convert the PCM coded signal with the high bit width N and the sampling frequency $f_{osr}$, into a PCM coded signal with a low bit width M and a sampling frequency $f_{osr}$, M<N;

a thermometer coder (4), of which an input being connected with an output of the multi-bit Δ-Σ modulator (3), and which is to thermometer-code the PCM coded signal with the bit width M and the sampling frequency $f_{osr}$, to convert it to a binary coded signal with a sampling frequency $f_{osr}$ and corresponding to $2^M$ digital channels of digital power amplifiers and speaker loads;

a multichannel mismatch shaper (5), connected with an output of the thermometer coder (4), and to eliminate non-linear harmonic distortion components of the synthesized signal introduced by the frequency response difference between each array element channel or each voice coil channel of the digital speaker load (the speaker array or the multiple voice coil speaker), push the harmonic frequency component power to a high frequency region out of the audible sound band, and thus reduces the harmonic distortion level in the audible sound band, and improves the reproduced sound quality level of the multiple speaker unit-based or multiple voice coil-based digital sound reproduction system;

a coding format converter (6), connected with an output of the multichannel mismatch shaper (5), and to convert the binary status coded data stream with an over-high on-off switching rate and with the sampling frequency $f_{osr}$ and corresponding to $2^M$ digital channels by down-sampling coding format converting according to a down-sampling frequency $D_{SR}$ $D_{SR}$, to obtain a 1-bit data stream with an on-off switching rate $f_{dsr}=f_{osr}/D_{SR}$ and corresponding to $2^M$ channels. After coding format converting, the original PDM (Pulse Density Modulation) coded signal with the over high on-off switching rate on each channel is converted into a digital coded signal with a relatively low on-off switching rate, and this coded signal with the relatively low on-off switching rate after amplified by a power MOSFET transistor can keep the abilities of harmonic suppression and channel deviation immunization of multi-bit Δ-Σ modulation and dynamic mismatch shaping processing, and meanwhile, this converted digital coded signal with a low rate can significantly reduce the on-off switching times of the power MOSFET transistor, reduce the sharp glitch number and amplitude introduced by the switching process of the power MOSFET transistor, decrease the distortion and noise components included in the reproduced sound signal, and reduces the power dissipation and heating problems of the power MOSFET transistor;

a multi-channel digital power amplifier (7), connected with an output of the coding format converter (6), and to power amplify the coded signals with the low on-off switching rate of the $2^M$ channels, and to drive a backward stage digital load (a speaker array or a multiple voice coil speaker) to reproduce a sound signal;

a speaker array or a multiple voice coil speaker (8), connected with an output of the multi-channel digital power amplifier (7), and to accomplish a sonic-electric converting operation, to convert the digital switch electrical signal to an analog sound signal.

In the above mentioned technical schemes, the digital input interface (1) divides the process manners into two kind, an analog manner or a digital manner, according to the analog or digital format of the sound source file: for the analog format of input sound source file, the digital input interface (1) firstly converts the analog signal by an ADC (Analog-to-Digital Converter) chip, into a PCM coded format supported by the ADC chip, and then according to a sampling frequency (typically, 44.1 KHz to 192 KHz) and a bit width (typically 16 bits to 24 bits) specified by the digital speaker system, into a PCM coded signal required by the system device; for the digital format of input sound source file, the digital input interface (1) only needs to convert the input signal, according to a sampling frequency $f_o$ (typically, 44.1 KHz to 192 KHz) and a bit width N (typically 16 bits to 24 bits) specified by the digital speaker system, into a PCM coded signal required by the system device.

The digital input interface (1), as shown in FIG. 14, can be connected with the analog audio input interface through the analog-to-digital conversion chip, can be connected with the analog audio input interface through an optical fiber or a coaxial line, can be connected with a micro network such as a mobile phone, a IPAD and a laptop personal computer through wireless network interface (including Bluetooth, Wi-Fi, Zigbee, etc.) to achieve the audio file input, can be connected with some special audio codec equipments such as a computer and a special player through the wired network interface (including LAN, Internet and the like), can be read and playback the audio files in a FLASH storage medium such as an U disk, a SD card and a solid state disk, etc. through a digital drive interface, and also can read and playback the audio files in a disc storage medium such as CD disc, DVD disc, Blue ray disc through an optical driver.

In the above mentioned technical schemes, the oversampling interpolation filter (2), comprises a FIR oversampling interpolation filter and a CIC oversampling interpolation filter, the FIR filter is used for processing interpolation of a small oversampling rate, and the CIC liter is used for processing interpolation of a larger oversampling rate. The oversampling interpolation filter (2), determines the orders of the FIR oversampling interpolation filter and the CIC oversampling interpolation filter according to the final oversampling rate, and employs the CIC oversampling interpolation filter at the last stage.

The hardware implementation of the FIR oversampling interpolation filter is shown in FIG. 15, and mainly comprises three parts, a RAM (or a register) module (9), a ROM lookup table module (10), and a multiply-adder module (11). The RAM (or the register) module (9), needs to store the input signal sample point gathered by a high speed oversampling clock (the ratio between this oversampling clock and the oversampling clock of the input signal equals to the order of the FIR filter) into the RAM (or the register) in real time; and meanwhile, needs to read a signal sample point value corresponding to the FIR filter coefficient from the storage space of the RAM (or the register) according to a clock tick of convolution operation in real time, and to participate in the multiply-add operation of the FIR filter coefficient. The ROM lookup table module (10), fixes the FIR filter coefficient according to a specified bit width, which will not be lost when the system power down; and can send the stored coefficient to the multiply-adder module in real time when progressing the convolution operation. The multiply-adder module (11), completes the convolution operation between the signal sample point sent by the RAM (or the register) module and the filter coefficient sent by the ROM lookup table module in real time according to the clock tick of the convolution operation.

The hardware implementation of the CIC oversampling interpolation filter is shown in FIG. 16, and mainly comprises four parts, a delayer (12), a differentiator (13), an oversampling module (14) and an integrator (15), the delayer (12) delayed processes an input signal according to a specified delay cycle, the differentiator (13) progresses difference operation on an input signal, the oversampling module (14) over-samples an input signal according to an oversampling multiple specified by the CIC filter, and the integrator (15) progresses integral operation on an input signal. The orders of the differentiator (13) and the integrator (15) in the CIC oversampling interpolation filter requires to be designed according to the oversampling rate of the CIC filter, to achieve a satisfying interpolation filtering effect.

In the above mentioned technical schemes, the hardware implementation of the multi-bit Δ-Σ modulator (3) is shown in FIG. 17, and mainly comprises three parts, a shift add and sub operation module (16), an integral operation module (17) and a quantizer (18). The shift add and sub operation module (16) weighted processes an input signal according to the modulator coefficient used by the Δ-Σ modulator by shift add and sub operation, so as to complete point multiplication operation between the input signal and the modulator coefficient, and the modulator coefficient employs a CSD coding format which can process the modulator coefficient by polynomial expansion according to a power exponent of 2, so as to convert the multiplication operation of the input signal and the modulator coefficient into the shift add and sub operation, thereby saving the implementation complexity of the multiplier, and reduce the hardware resource consumption. The integral operation module (17) processes an input signal by integral operation according to a transfer function $$\frac{1}{z-1}$$

of integral operation, and the quantizer (18) quantized codes the modulated signal after weighting and integral processing of the modulator coefficient according to a quantized electric level stage with a specified bit width, to obtain a low bit-width PCM coded signal with the specified bit-width.

In the above mentioned technical schemes, the hardware implementation of the thermometer coder (4) is shown in FIG. 18, and a single channel low bit-width PCM coded signal with a bit width M and a sampling frequency $f_{osr}$, passes through $2^M$ quantized electric level stages and $2^M$ comparators (19), to obtain binary coded parallel output vectors with a bit width of 1, a sampling frequency $f_{osr}$ and corresponding to $2^M$ channels.

In the above mentioned technical schemes, the hardware implementation of the multichannel mismatch shaper (5) is shown in FIG. 19, and mainly comprises, an error generating module (21), a shaping processing module (22), a minimum searching module (23), a subtraction operation module (24) and a quantizer module (25). The error generating module (21) is to compare a coding error between an input coded signal and an output coded signal of the thermometer coder module (20), and to output coding error values of the $2^M$ channels. The shaping processing module (22), is to shaping process the coding error sent by the error generating module (21) according to a designed mismatch shaping function, and to output shaped coding error signals. The minimum searching module (23) receives the shaped multi-channel error signals incoming from the shaping processing module (22), searches the minimum value within the transmitted data of the channels by repeatedly comparing, and outputs the minimum value. The subtraction operation module (24), receives the multi-channel coding error signals from the shaping processing module (22), and the minimum value in the multi-channel data obtained by sorting treatment from the minimum searching module (23), by means of subtraction operation, is subtracted from the multi-channel coding error signals, and the subtraction-processed multi-channel signals are output. The quantizer module (25), generates $2^M$ quantized level stages by multiple groups of comparators, and sends the quantized level stages to the thermometer coder (20) by which a conversion from single channel of M-bit PCM code to $2^M$ channels of 1-bit PDM codes is completed.

In the above mentioned technical schemes, a preferred implementation manner of the coding format converter (6) is shown in FIG. 20, and mainly comprises a Δ-Σ modulator (26) and a PWM modulator (27). The Δ-Σ modulator (26) is to complete a conversion from the 1-bit PDM coded signal to a PCM coded signal with a low bit width L; the PWM modulator (27) is to complete a conversion from the PCM coded signal with a low bit width L to a PWM coded signal.

In the above mentioned technical schemes, the implementation manner of the multi-channel digital power amplifier (7) is shown in FIG. 21, and mainly comprises: a gate driver (28), a MOSFET power transistor (29) and a feedback network (30). The gate driver (28) is to convert the PWM coded signal generated by the coding format converter (6) into an switching control signal driving the MOSFET power transistor (29) to switch on/off, and the MOSFET power transistor (29) switches on/off in a high speed according to the switching control signal of the gate driver (28), and thus drives the speaker to sound; the feedback network (30) is to convert a power signal on a lead of the speaker into a small amplitude signal and send the small amplitude signal to the PWM modulator (27), realize a feedback correction function, reduce the harmonic wave and noise of power amplifying, and improve the performance level of power amplifier.

In the above mentioned technical schemes, in the speaker array or the multiple voice coil speaker (8), all speaker units or all voice coils are connected with the digital power amplifier (7) to complete the complete synthesis and reproduction of an audio signal by cooperation of the multiple units or the multiple voice coils. The speaker array or the multiple voice coil speaker (8), can be applied in personal sound systems such as a hand phone, a IPAD, a personal computer and the like, and also can be applied in conference systems such as classroom conference system, a hall conference system and the like, and can be applied in a vehicle-mounted reproducing system as well. The speaker array or the multiple voice coil speaker (8), can be implemented by a MEMS (Microelectromechanical Systems) speaker.

In the above mentioned technical schemes, the distribution of the spacial radiation sound field generated by the speaker array or the multiple voice coil speaker (8), affects by different spacial arrangement manners of the array and different bit numbers of the Δ-Σ modulation, and with the enlarging of the array aperture and the increasing of the bit numbers of the Δ-Σ modulation, the directionality of the generated spacial radiation sound field becomes more apparently, a local region nearby the symmetry axis of the array has the best sound quality and the largest sound pressure, the region more departs from the best region, the sound quality of the radiation sound field has a worse sound quality and a lower sound pressure. In the case that the array has a relatively large aperture size, the array has a relatively obvious control effect on the sound field, and the control effect on the sound field is different from that formed by a conventional linear array beam, because the signals radiated by each array element channel is part of the bit information, while the signals radiated by each array element channel of the conventional beam is a cope of the sound source signal, and it is because the signals radiated by each array element of the system have different information content, the sound field generated by this system in space not only has amplitude changes of the sound pressure, but also has different changes in harmonic distortion, intelligibility and tone quality.

Then present invention has the following advantages over the prior art:

A. The input signal amplitude optimization-based DEMISAO-DEM (Input Signal Amplitude Optimization-Dynamic Element Mismatched) shaping algorithm employed by the present invention, can dynamically adjust the number of channels participating in mismatch shaping according to the amplitude of the input signal, and dispose the rest channels not participating in shaping to close or sleep, and this DEM method of dynamically managing the hardware resources according to the input signal amplitude, can save the hardware resources occupied by the algorithm, reduce the overhead of the hardware resource, and save power consumption of the hardware.

B. The ISAO-DEM shaping algorithm employed by the present invention, may optimize and combine the speaker unit or the voice coil participating in sound reproduction, to ensure the total harmonic distortion of the reproduced sound field generated by the combined speaker units or voice coils is minimum. The ISAO-DEM shaping algorithm switching controls the speaker unit load or the voice coil load according to the principle of minimizing total harmonic distortion of the reproduced sound field, and ensures each speaker unit or each voice coil participates in sound reproduction according to a principle of equal probability, and ensures every speaker unit or every voice coil participates in sound reproduction in its own best response state, and thus ensures the sound quality level of the reproduced sound field. The working manner of controlling on-off switching of each speaker unit or each voice coil by the ISAO-DEM shaping algorithm, corresponds to whitening the total harmonic components of the reproduced sound field, and dispersing the harmonic power into the entire sound frequency band, and the whitened harmonic power presenting as noise format in the entire frequency band, reduces the harmonic distortion level, and improves the sound quality level of the reproduced sound, and meanwhile reduces the harmonic interference level of the digital speaker system device, lowers the electromagnetic radiation level of the system, and decreases the interference on around other electronic products brought by electromagnetic radiation.

C. The present invention controls the speaker units (the speaker array load) or the speaker voice coils (the multi-voice coil speaker) to be equalized used according to a clock tick by the ISAO-DEM shaping algorithm, which avoids each speaker unit or each speaker voice coil to be in a long-term overload running state, protects the normal use of the speaker array or the multi-voice coil speaker, and increases the service life of the speaker array or the multi-voice coil speaker. This working manner of avoiding the overload of the speaker units or the speaker voice coils, and also ensures every speaker unit or every voice coil participates in sound field reproduction in its own best response state, and thus ensures the reproduced sound field of the system is in the best sound quality level.

D. The present invention controls the speaker units (the speaker array load) or the speaker voice coils (the multi-voice coil speaker) to be equalized used according to a clock tick by the ISAO-DEM shaping algorithm, and this on-off switching mode based on a principle of equalized using the speaker units or the speaker voice coils, can obviously reduce the electric energy consumption level during the system works, and when compared with the traditional analog system, this on-off switching based digital system only has an electric energy consumption that is $\frac{1}{4}$ to $\frac{1}{8}$ of the traditional analog system, and possesses an obvious energy-saving characteristic. The digital reproducing system allocating, real-time managing and controlling the on-off switching of multiple speaker units or multiple speaker voice coils by dynamically coding, possesses an excellent energy-saving characteristic, and is especially suitable for portable consumption electronic products, and can obviously enhance the battery life of a battery and a product thereof.

E. The coding format conversion employed by the present invention, can convert a coded signal with an over high on-off switching rate into a coded signal with a relatively low on-off switching rate, and this coded signal with the relatively low on-off switching rate after amplified by a power MOSFET transistor can keep the abilities of harmonic suppression and channel deviation immunization of multi-bit Δ-Σ modulation and dynamic mismatch shaping processing, and meanwhile reduces the sharp glitch number and amplitude generated during the switching process of the power MOSFET transistor, and reduces the power loss during the switching process. Moreover, the present invention, by means of coding format conversion, can solve the limiting problem of the existing digital speaker system device with a very low power (only limited to a magnitude of 1 W), and raise the power of a single transmission channel of the digital speaker system device to a magnitude of hundreds or thousands of watts, and thus popularize the digital speaker system device into more application fields.

F. The signal processing such as multi-bit Δ-Σ modulating, thermometer coding, multi-channel mismatch shaping and digital format converting, etc. employed by the present invention, in the process of driving the speaker load (the speaker array or the multiple voice coil speaker) to sound by digital power amplifying, the speaker load (the speaker array or the multiple voice coil speaker) is made to possess self-demodulating and self filtering characteristics, without relying on a traditional analog LC low-pass filter consisting of an analog inductor and a analog capacitor to conduct low-pass filtering demodulating process, rather than completing the low-pass filtering process by its own electro-acoustic conversion process of the speaker load; the self-demodulating and self filtering characteristics accompanying with its own physics conversion process of the speaker, omit power filter elements on multiple transmission channels—bulk and expensive inductors and capacitors, decrease the complexity of the hardware implementation, save the manufacturing cost of the hardware, and also save the volume and weight of the hardware device; meanwhile avoid the amplitude fluctuation of the frequency response of the reproduction system introduced by the frequency response of the filtering network of the inductor and the capacitor, and enhance the sound field reproducing quality of the reproduction system.

G. In digital speaker system device presented by the present invention, the coded information received by the channels of each speaker unit or each voice coil only contains part of the coded information in the input sound source coded information, and the SNR of the reproduced signal recovered by filtering by the channels of each speaker unit or each voice coil is not high enough, while all the signals filtered by all speaker unit channels or all voice coil channels participate in the reproduction of the sound field, the SNR level of the system device can be improved largely. The work manner of this digital speaker device is entirely different from the work manner of the traditional speaker device in that, every speaker unit or every voice coil included in the traditional speaker device is an independent signal channel, and the signal received by each speaker unit or each voice coil contains all coded information of the input sound signal, and a single speaker unit or a single voice coil can independently complete the entire reproduction of the input sound resource information; and adding one sound reproduction channel, can only increase the SNR by 3 dB. While in the digital speaker device, a single speaker unit or a single voice coil cannot independently complete the entire reproduction of the input sound resource information, and has to rely on the cooperation between all speaker units or all single voice coils to complete the entire reproduction of the input sound resource information, and all speaker units or all single voice coils join up in essence to act as an independent virtual channel to complete the entire reproduction of the input sound resource information. This cooperation manner of multiple channels, can achieve a coherent integration of the reproduced signals; in a 3-bit Δ-Σ modulating sound reproducing system, totally 8 sound reproducing channels participate in sound reproduction, although the SNR level also increases step by step according to a level of 3 dB, when all the sound reproducing channels participate in the synthesis of the reproduced sound field, the SNR level can achieve a sharp increase of 55 dB.

H. This manner of completing the entire reproduction of the input sound resource information by relying on multiple speaker units or multiple speaker voice coils presented by the present invention, is in essence a reproducing manner of obtaining spacial redundancy by means of increasing the speaker units or the speaker voice coils, and this sound reproducing manner of increasing the spacial redundancy, can obviously improve the sound quality level of the reproduced sound field; this sound reproduction system, is suitable for being applied to reproduction situation of presenting multiple musical instruments, multiple voice coils and complex background sound, and can significantly increase the isolation degree and hierarchy of each sound channel.

I. The present invention presents that by joining up multiple speaker units or multiple single voice coils to cooperate, to complete the entire reproduction of the input sound resource information, and this implementation manner of the sound reproduction system, provides an effective implementation approach of obtaining a large sound power output under the situation of low-voltage power supply. Although the sound pressure output provided by a single speaker unit or a single voice coil under the condition of low-voltage power supply is relatively limited, after the coherent superposition of the reproduced sound signals of multiple speaker units or multiple voice coils to achieve the desired sound pressure output level, this implementation manner of the sound reproduction system with multiple speaker units or multiple speaker voice coils is suitable for a situation of low-voltage power supply, and can significantly reduce the complexity of the power supply system and improve the reliability, and is easy to be popularized and applied in various application situations.

J. The digital speaker system device presented by the present invention, the signal processing process thereof are entirely implemented in digital domain, and in such way, by means of chip designing and manufacturing, these signal processing process, power amplifying and even the speaker units are integrated into a very small chip packaging and completed, and in the hardware implementation, multiple digital-to-analog conversion chip included in a traditional multi-channel sound reproduction system can be get rid of, accordingly saves the hardware implementation cost and the hardware space usage of the multi-channel sound reproduction system; meanwhile, this multi-channel signal processing chip with a high integration density, may also save the overhead of electric energy, is very suitable for use in a portable system powered by battery, and can significantly increase the battery life of a battery and a system. In addition, this digital sound reproduction system without digital-to-analog conversion, also avoids the quantizing noise introduced by the digital-to-analog conversion process, and thus ensures the digital sound reproduction system possesses a sound field reproduction performance of high fidelity.

K. The present invention presents a third mismatch shaping algorithm, which further optimizes the second order VFMS algorithm, and can significantly enhance the attenuation and suppression abilities on the harmonic wave and the noise, and when compared with the second order VFMS algorithm, the third-order VFMS mismatch shaping algorithm can achieve a increase of 16 dB SNR.

DETAILED DESCRIPTION OF EMBODIMENTS

In the following, the present invention are explained in detail combining the accompanying drawings with the specific embodiments:

At present, in the existing digital speaker products based on multi-bit I-Δ modulation and mismatch shaping, the modulator thereof employs an analog switching circuit filtering circuit, and the maximum power of one single output sound channel can only be 1 W, which can not meet the requirements of actual applications. The implementation method and the device of the digital speaker system presented by the present invention, the modulator thereof entirely employs digital filters to achieve, and by means of coding format converting, the switching rate of the switching signal has been reduced, and therefore the power of the system device can reach to a power level of hundreds or even thousands of watts. The present invention also presents an ISAO-DEM shaping algorithm and a 3rd-order VFMS shaping algorithm, which effectively reduce the power and resource consumptions of the shaper, and enhance the harmonic wave and noise suppression abilities of the mismatch shaping algorithm.

The present invention utilizes the Δ-Σ modulating technology to convert a high bit-width PCM coded signal into a low bit-width PCM coded signal, then converts the low bit-width PCM coded signal of M bits into a binary coded signal with equal bit weights corresponding to $2^M$ transmission channels, and completes the electro-acoustic conversion to generate a reproduced sound field by $2^M$ speaker units or $2^M$ voice coils, these speaker units or these voice coils achieving the complete synthesis of the sound source signal by linear superposition.

Figure 13:
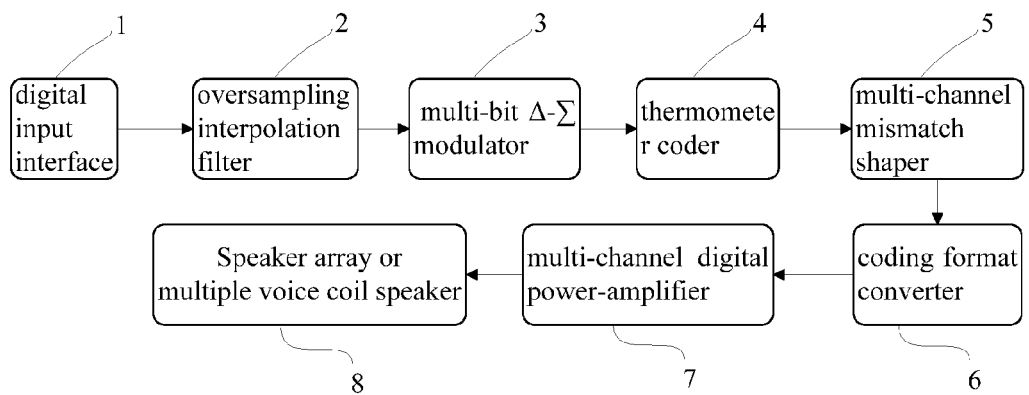
FIG. 13 shows a schematic diagram of the composition modules of a multi-bit Δ-Σ modulation-based digital speaker system device presented by the present invention.
Figure 14:
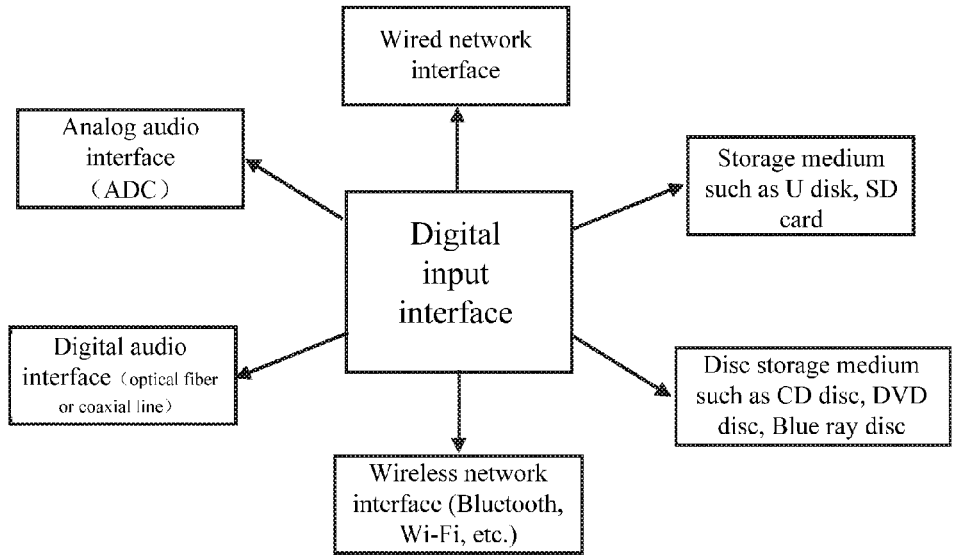
FIG. 14 shows a composition schematic diagram of the digital input interface of the digital speaker system device presented by the present invention.
Figure 15:
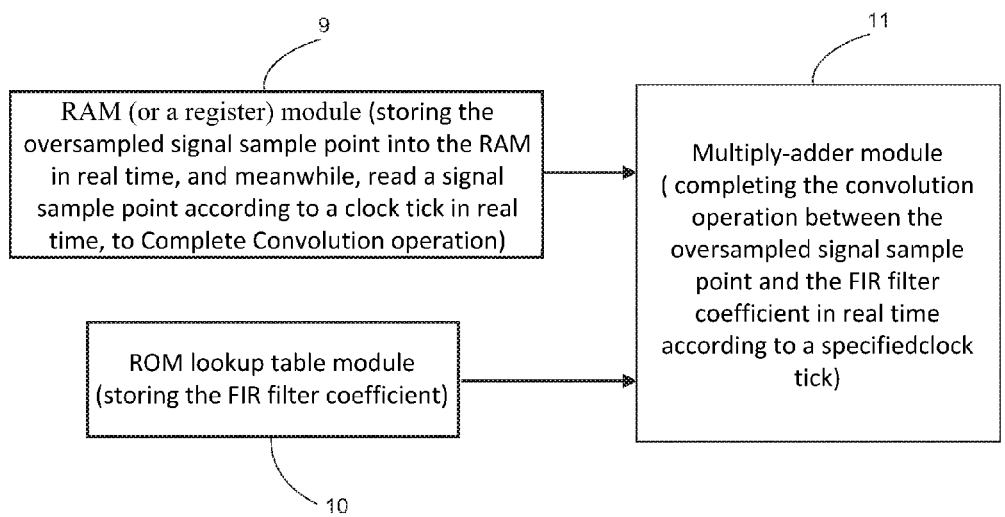
FIG. 15 shows a block diagram of the hardware implementation of the FIR oversampling interpolation filter in the digital speaker system device presented by the present invention.
Figure 16:
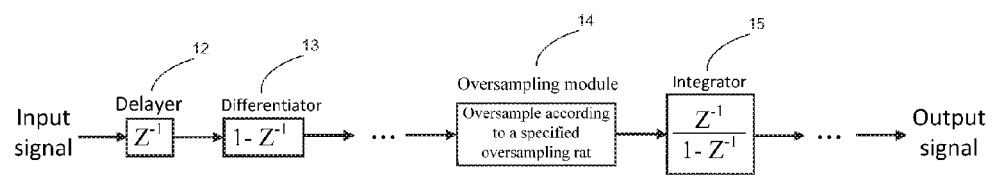
FIG. 16 shows a block diagram of the hardware implementation of the CIC oversampling interpolation filter in the digital speaker system device presented by the present invention.
Figure 17:
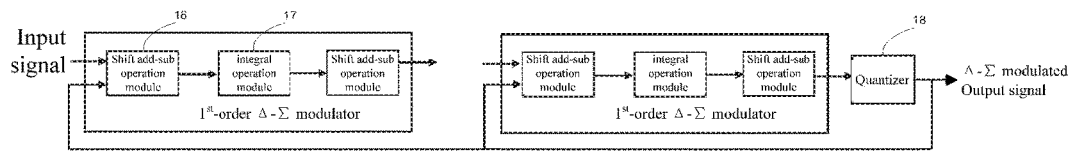
FIG. 17 shows a block diagram of the hardware implementation of the multi-bit Δ-Σ modulator in the digital speaker system device presented by the present invention.
Figure 18:
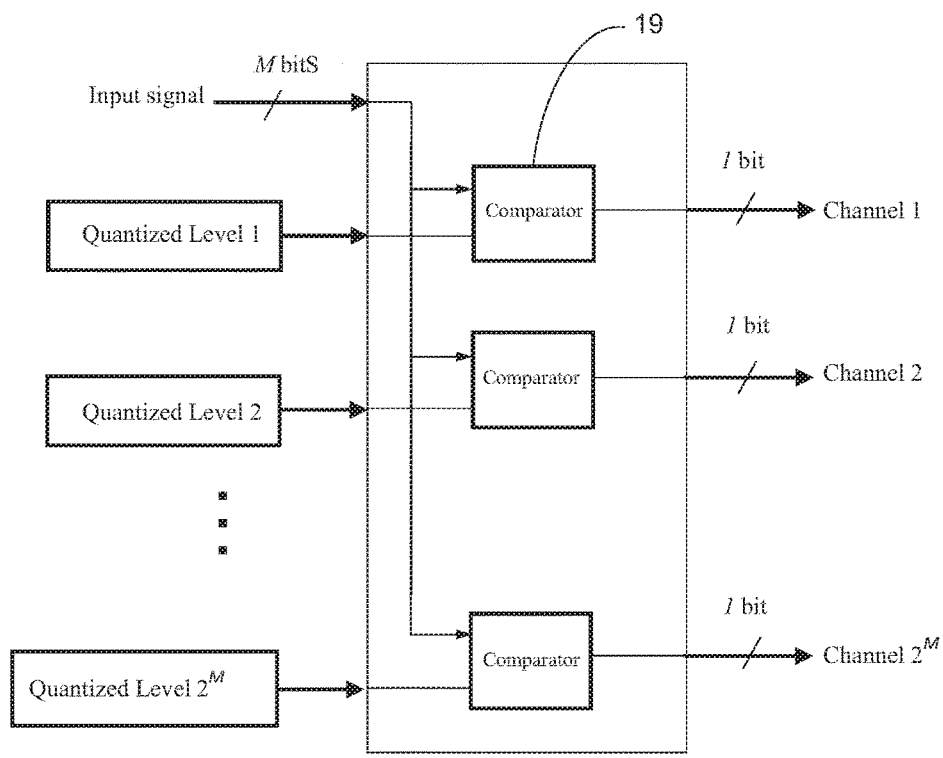
FIG. 18 shows a block diagram of the hardware implementation of the thermometer coder in the digital speaker system device presented by the present invention.

As shown in FIG. 13, a multi-bit Δ-Σ modulation-based digital speaker system device manufactured according to the present invention, mainly consists of a digital input interface 1, an oversampling interpolation filter 2, a multi-bit Δ-Σ modulator 3, a thermometer coder 4, a multi-channel mismatch shaper 5, a coding format converter 6, a multi-channel digital power-amplifier 7, and a speaker array or a multiple voice coil speaker 8.

1) the digital input interface 1, comprises two kinds of input interfaces for a digital input format and an analog input format, and for the digital input format, a USB interface chip of Type PCM2706 from TI company can be utilized to read a MP3 type file stored in a PC into a FPGA chip of Type Cyclone III EP3C80F484C8 in real time through the I2S interface protocol via a USB port according to a bit width of 16 bits and a sampling frequency of 44.1 KHz; for the analog input format, an analog-digital conversion chip of Type AD 1877 from ANALOG DEVICES company can be utilized to convert the analog sound resource signal into a PCM coded signal of 16 bits and 44.1 KHz, and to read it into a FPGA chip in real time also through the I2S interface protocol.

2) the oversampling interpolation filter 2, is connected with an output of the digital input interface 1, and inside the FPGA chip, conducts the oversampling interpolation filtering of the PCM coded signal of 16 bits and 44.1 KHz via 4 stages of filters, 3 stages of the FIR oversampling interpolation filter and 1 stage of the CIC oversampling interpolation filter. The first stage employs the FIR interpolation filter, with an oversampling interpolation factor of 2, an order of 128 and a raised sampling frequency of 88.2 KHz; the second stage employs the FIR interpolation filter, with an oversampling interpolation factor of 2, an order of 32 and a raised sampling frequency of 176.4 KHz; the third stage employs the FIR interpolation filter, with an oversampling interpolation factor of 2, an order of 16 and a raised sampling frequency of 352.8 KHz; the fourth stage employs the CIC interpolation filter, with an oversampling interpolation factor of 32, and a raised sampling frequency of 11.2896 MHz. After the four stages of interpolation filtering, the original PCM signal of 44.1 KHz and 16 bits is converted into an sampling PCM signal of 11.2896 MHz and 16 bits.

Figure 1:
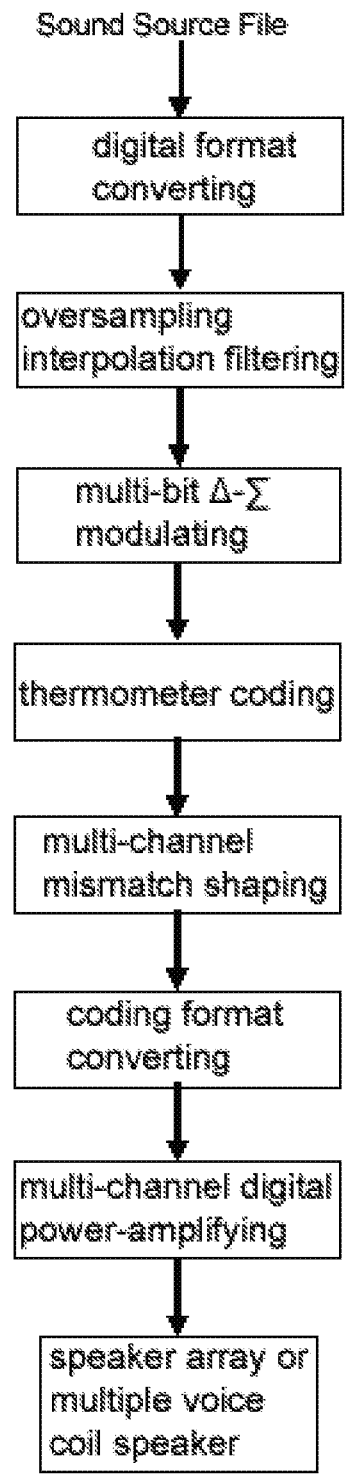
FIG. 1 shows a signal flow chart of an implementation method of a multi-bit Δ-Σ modulation-based digital speaker system presented by the present invention.
Figure 2:
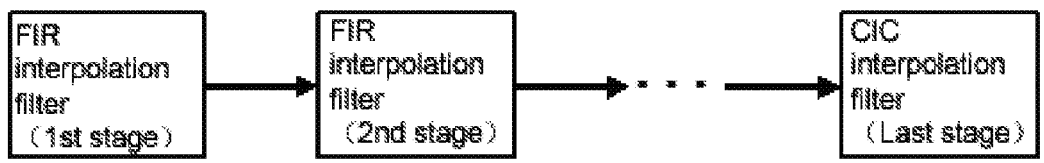
FIG. 2 shows a signal processing flow chart of the oversampling interpolation filtering in the implementation method of the digital speaker system presented by the present invention.
Figure 3:
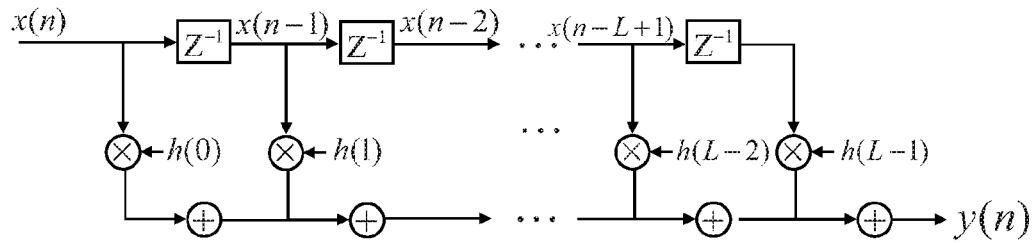
FIG. 3 shows a signal processing flow chart of the FIR interpolation filter in the implementation method of the digital speaker system presented by the present invention.
Figure 4:
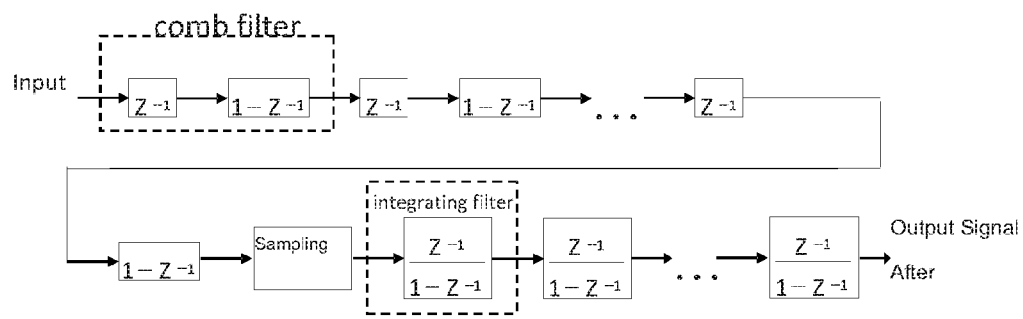
FIG. 4 shows a signal processing flow chart of the CIC interpolation filter in the implementation method of the digital speaker system presented by the present invention.
Figure 5:
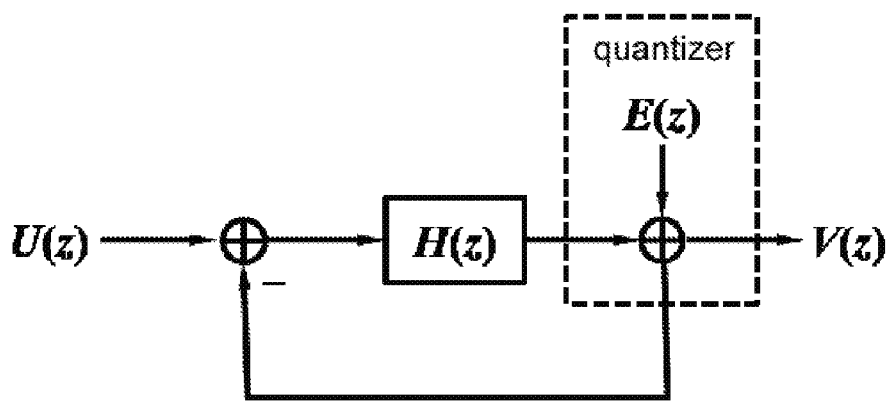
FIG. 5 shows a signal processing flow chart of the multi-bit Δ-Σ modulation in the implementation method of the digital speaker system presented by the present invention.
Figure 6:
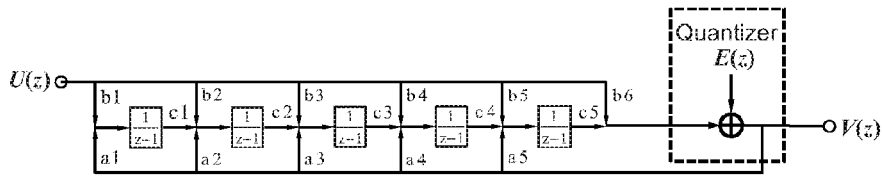
FIG. 6 shows a signal processing flow chart of a CIFB structure-based 5th-order Δ-Σ modulator in the implementation method of the digital speaker system presented by the present invention.

3) the multi-bit Δ-Σ modulator 3, is connected with an output of the oversampling interpolation filter 2, and converts the PCM coded signal of 11.2896 MHz and 16 bits into a Δ-Σ modulated signal of 11.2896 MHz and 3 bits; As shown in FIG. 6, the Σ-Δ modulator employs a 5th-order CIFB (Cascaded Integrators with Distributed Feedback) topological structure. Assuming the oversampling interpolation factor of the modulator is 256, the coefficient of its topological structure is as shown in Table 1. In order to save the hardware resource and reduce its implementation cost, inside the FPGA chip, the shift additive operation generally is used to take the place of the multiplying operation, and the parameters used by the Σ-Δ modulator represent by a CSD code.

Figure 7:
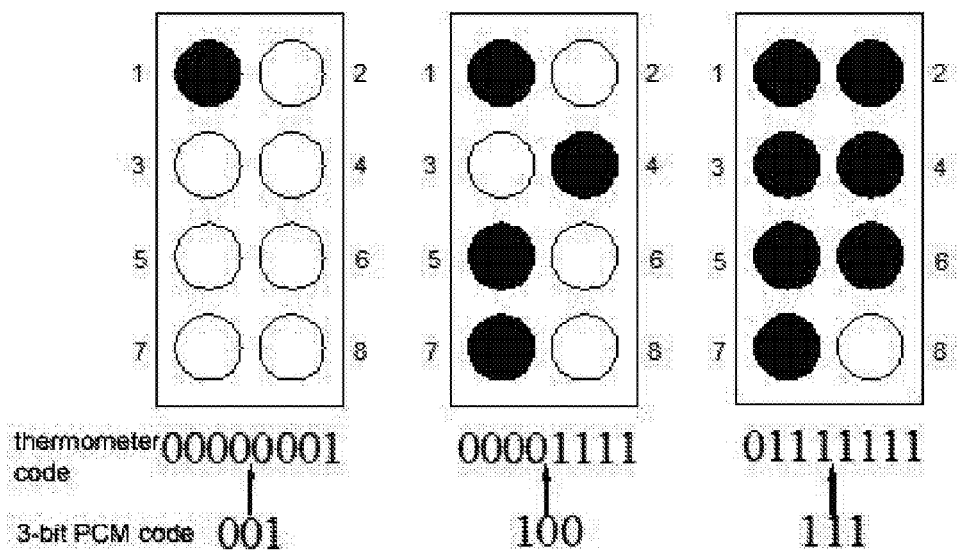
FIG. 7 shows a schematic diagram of controlling the array element channel to switch by thermometer coding in the implementation method of the digital speaker system presented by the present invention.
Figure 8:
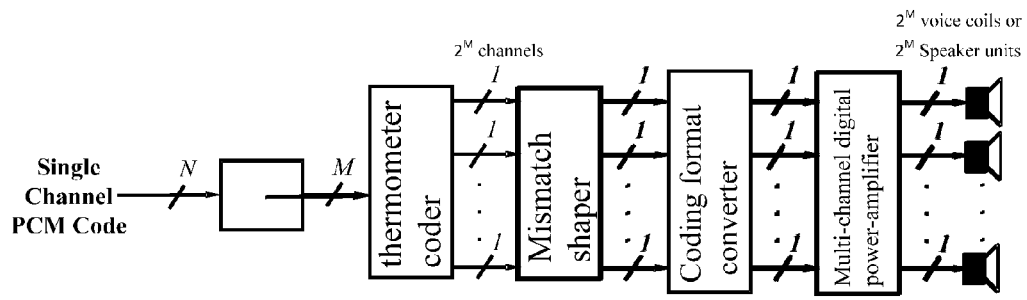
FIG. 8 shows a signal processing flow chart of the multi-channel mismatch shaping in the implementation method of the digital speaker system presented by the present invention.
Figure 9:
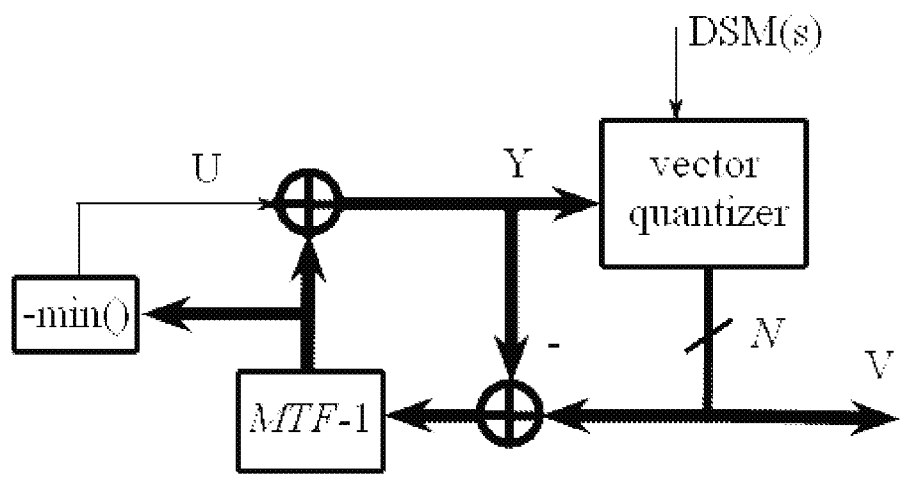
FIG. 9 shows a block diagram of implementing the multi-channel mismatch shaping in the implementation method of the digital speaker system presented by the present invention.
Figure 10:
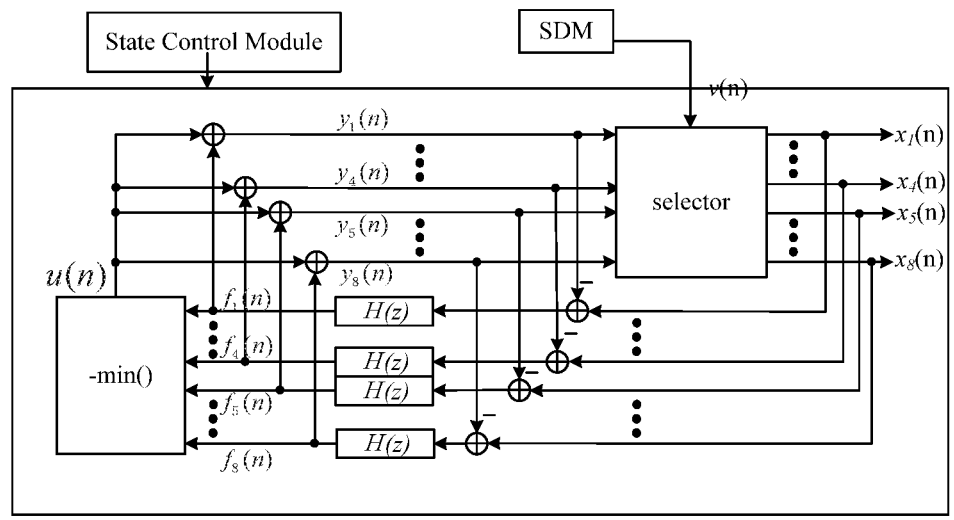
FIG. 10 shows a signal processing flow chart when the ISAO-DEM algorithm presented by the present invention processes a 8-channel shaping.
Figure 11:
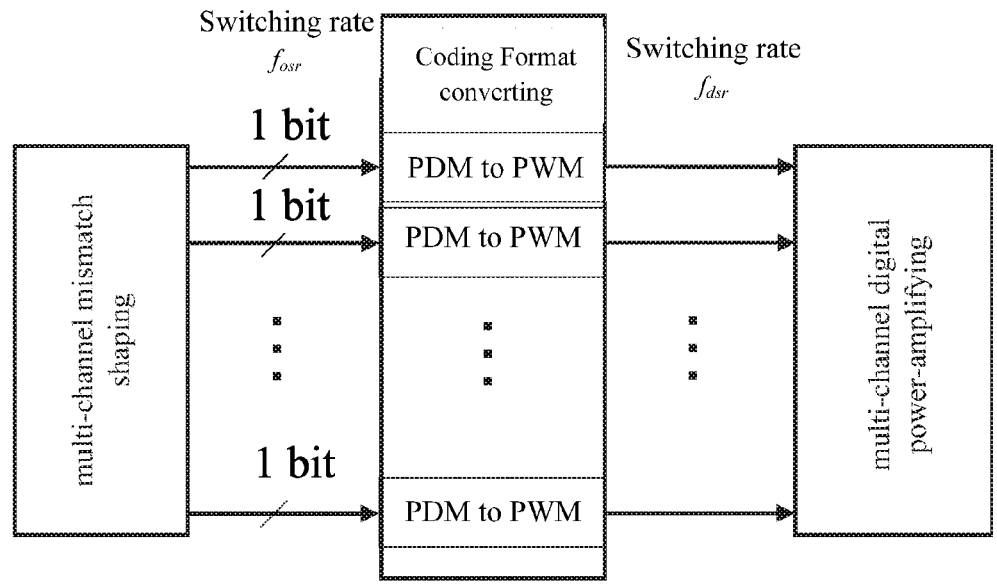
FIG. 11 shows a signal processing flow chart of the coding format conversion in the implementation method of the digital speaker system presented by the present invention.
Figure 12:
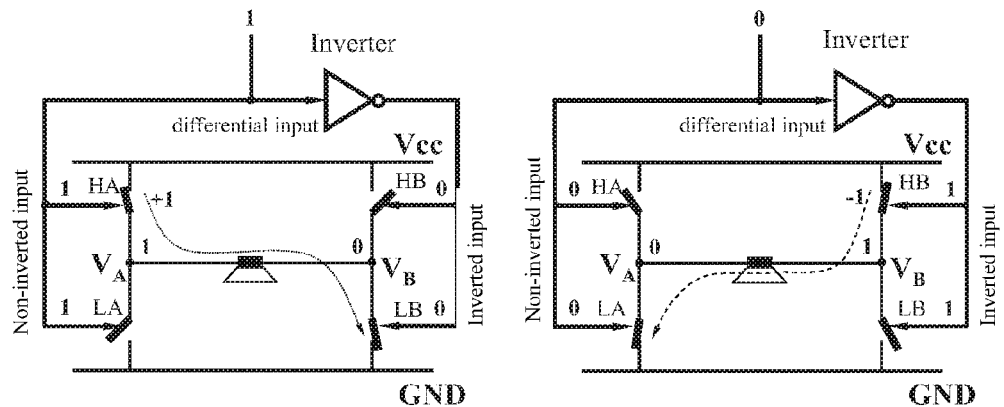
FIG. 12 shows a schematic diagram of on-off switching process of the full-bridge power amplifier circuit in the implementation method of the digital speaker system presented by the present invention.

4) the thermometer coder 4, is connected with an output of the multi-bit Δ-Σ modulator 3, converts the PCM coded signal of 11.2896 MHz and 3 bits according to a thermometer-coding manner into parallel output binary status coded vectors of 11.2896 MHz and 1 bit corresponding to 8 digital channels. As shown in FIG. 7, when the 3-bit PCM code is "001", the thermometer code converted from it is "00000001", which indicates that only one digital channel of the 8 digital channels has an output state "1", and the other 7 digital channels have an output state "0"; when the 3-bit PCM code is "100", the thermometer code converted from it is "00001111", which indicates that 4 digital channel of the 8 digital channels have an output state "4", and the other 4 digital channels have an output state "0"; when the 3-bit PCM code is "111", the thermometer code converted from it is "01111111", which indicates that only one digital channel of the 8 digital channels have an output state "0", and the other 7 digital channels have an output state "1".

Figure 19:
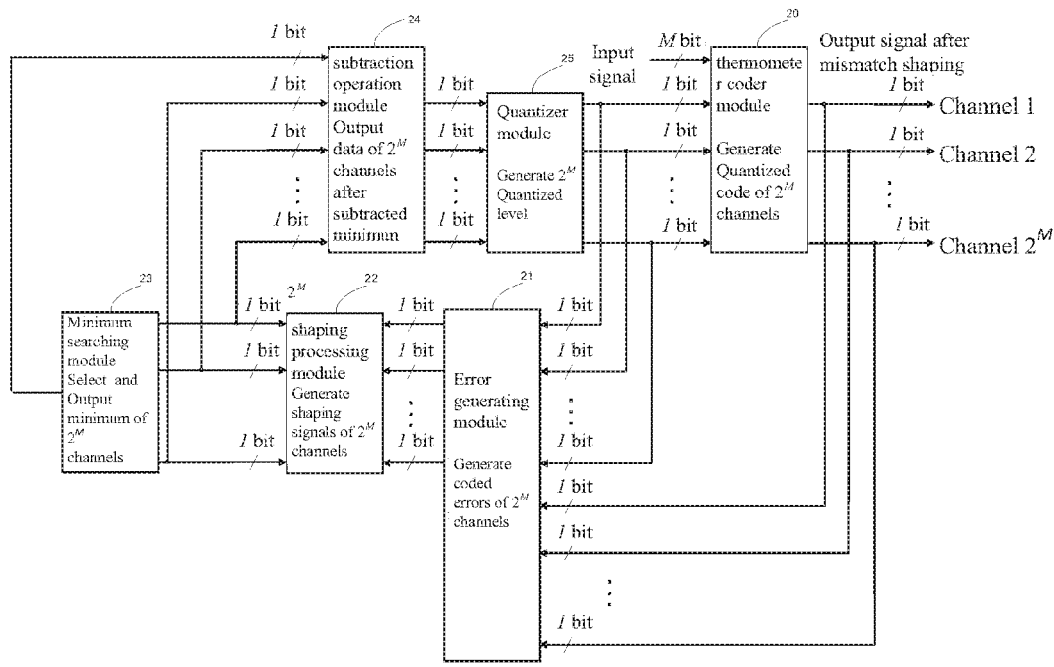
FIG. 19 shows a block diagram of the hardware implementation of the multi-channel mismatch shaper in the digital speaker system device presented by the present invention.

5) the multichannel mismatch shaper 5, is connected with an output of the thermometer coder 4, and is to eliminate non-linear harmonic distortion components introduced by the frequency response difference between various digital channels. The multichannel mismatch shaper 5 sorts the 8-bit thermometer code according to a principle of minimizing the non-linear harmonic distortion components, and consequently determines the code distribution manner of the 8 digital channels. As shown in FIG. 7, when the thermometer code is "00000001", after sorting by the dynamic mismatch shaper, the channels 1, 4, 5 and 7 are determined to be assigned with the code "1", and the channels 2, 3, 6 and 8 are assigned with the code "0", and thus ensuring the synthesized signal formed by the 8 digital channels contains a fewest harmonic distortion component. The multi-channel mismatch shaper employs a VFMS (Vector-Feedback mismatch-shaping) algorithm, and the signal processing flow chart thereof is as shown in FIG. 19, wherein the shaping processing module is a designed shaping filter, responsible for shaping the error signal generated by the vector quantizer, to push the harmonic component to the out-band high frequency region, and wherein MTF utilizes a 2nd-order filter structure, the z domain formula thereof is $(1-z^{-1})^2$. Inside the FPGA chip, the harmonic component existing in the original Δ-Σ coded signal is pushed to the out-band high frequency region, and thus improve the reproduction quality level of the in-band sound source signal.

Figure 20:
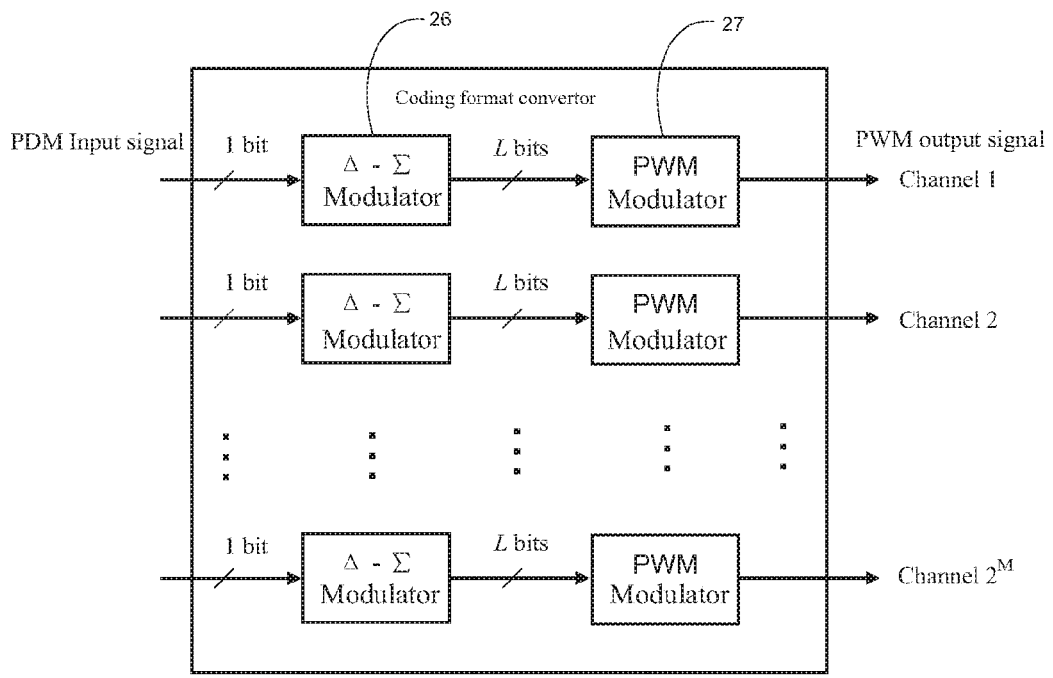
FIG. 20 shows a block diagram of the hardware implementation of the coding format converter in the digital speaker system device presented by the present invention.
Figure 21:
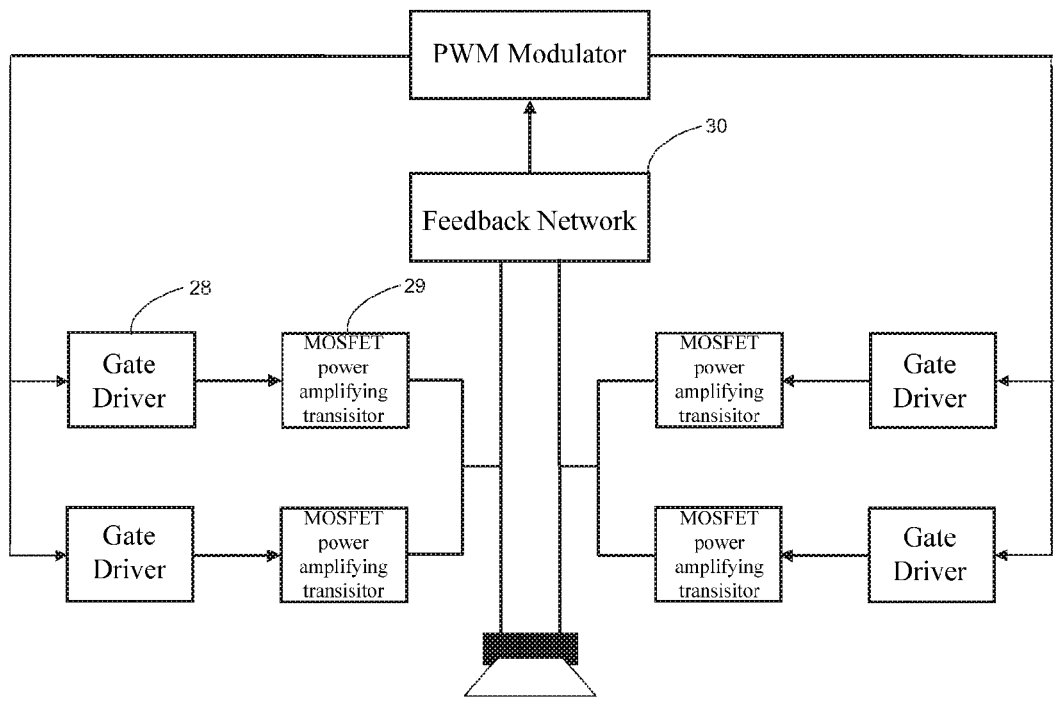
FIG. 21 shows a block diagram of the hardware implementation of the multi-channel digital power amplifier in the digital speaker system device presented by the present invention.

6) the coding format converter 6, is connected with an output of the multichannel mismatch shaper 5. As shown in FIG. 20, the coding format converter 6 converts the mismatch shaped 1-bit PDM coded signals with an on-off switching rate of 11.2896 MHz on the 8 transmission channels, into a PWM coded signal with an on-off switching rate of 793.8 KHz by the Δ-Σ modulator and the PWM modulator.

7) the multi-channel digital power amplifier 7, is connected with an output of the coding format converter 6. The digital power amplifier chip is selected to be a digital power amplifier chip of Type TAS5121 from TI company, which has a response time with a magnitude of 100 ns, and can respond to the PWM coded control signal of 793.8 KHz without distortion. This power amplifier chip has two half-bridge channels, and can drive a speaker unit by the two half-bridge channels to form a full-bridge power amplifier network. The PWM code generated by the coding converter, is directly output to an input of one half-bridge channel in one channel, and is, after phase revised, output to an input of the other half-bridge channel in another channel; this group of differential PWM control signals achieves the on-off control of the four MOSFET transistors of the full-bridge circuit, and forms current paths for two switching states "+1" and "−1".

8) the speaker array or the multiple voice coil speaker 8, is connected with an output of the multi-channel digital power amplifier 7. The digital speaker load employs a multiple voice coil speaker, and for each voice coil, the direct-current resistance is 4Ω, and the rated power is 3 W.

TABLE 1

| Parameter Name | Ideal Parameter | CSD Conversion | CSD Value |
|---|---|---|---|
| a1, b1 | 0.2065 | $2^{-2} - 2^{-5} - 2^{-6}$ | 0.2031 |
| a2, b2 | 0.2109 | $2^{-2} - 2^{-5} - 2^{-7}$ | 0.2305 |
| a3, b3 | 0.2289 | $2^{-2} - 2^{-8} - 2^{-6}$ | 0.3594 |
| a4, b4 | 0.2838 | $2^{-2} + 2^{-9} + 2^{-5}$ | 0.2832 |
| a5, b5 | 0.4656 | $2^{-1} - 2^{-8} - 2^{-5}$ | 0.4648 |

TABLE 1-continued

| Parameter Name | Ideal Parameter | CSD Conversion | CSD Value |
|---|---|---|---|
| b6 | 1 | | |
| c1 | 0.1205 | $2^{-3} - 2^{-8} - 2^{-11}$ | 0.1206 |
| c2 | 0.2904 | $2^{-2} + 2^{-5} + 2^{-7}$ | 0.2891 |
| c3 | 0.5926 | $2^{-1} + 2^{-4} + 2^{-5}$ | 0.5938 |
| c4 | 1.3746 | $2^{0} + 2^{-2} + 2^{-3}$ | 1.3750 |
| c5 | 3.8554 | $2^{2} - 2^{-6} - 2^{-3}$ | 3.8594 |

Embodiment 1

Figure 22:
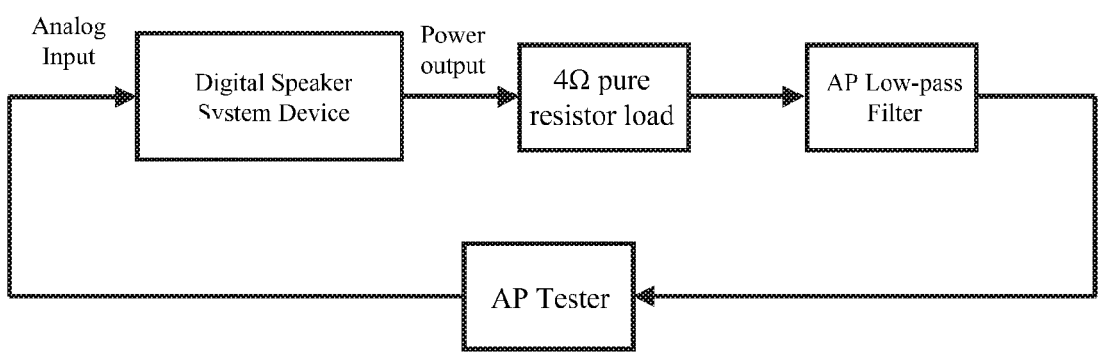
FIG. 22 shows a schematic diagram of measuring a single output channel of the digital speaker system device in the case of pure resistance load in the Embodiment 1 of the present invention.

In the present embodiment, as shown in FIG. 22, a power output of a single channel of the digital speaker system device is connected with a 4Ω pure resistor, then the received power single by the 4Ω pure resistor is filtered by a low-pass filter standard configured in an Audio Precision (AP) tester, the filtered signal is accessed into an input of the AP tester, and meanwhile the AP tester outputs a standard testing signal via its output to the digital speaker system device. In this way, by means of the AP tester, the frequency response curve, the signal to noise ratio (SNR) level and the output level of the harmonic distortion and noise (THD+N) of the single channel of the digital speaker system device in the case of pure resistance load can be achieved.

Figure 23:
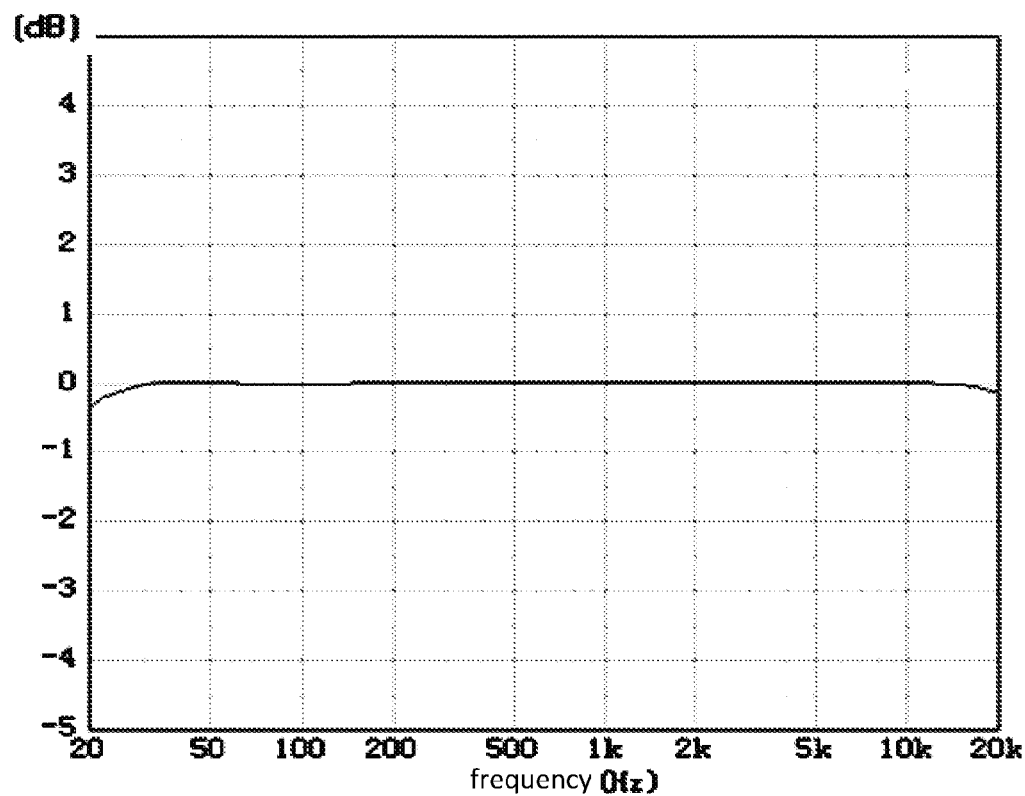
FIG. 23 shows a frequency response curve of a single output channel of the digital speaker system device in the Embodiment 1 of the present invention.

In the case that the output testing signal of the AP tester is an effective value of 1V, the frequency response curve of one single output channel of the digital speaker system device tested by the AP tester is shown in FIG. 23. It can be seen from the frequency response curve that, the system device substantially maintains a flat system frequency response within the whole audio frequency band range (20 Hz to 20 KHz), and in two sub-band ranges, from 20 Hz to 35 Hz, and from 15 KHz to 20 KHz, the frequency response curve only has an attenuation of 0.5 dB, which show that the entire digital speaker system device in the case of pure resistance output has an ideal frequency response curve which keep a well flatness.

In the case that the output testing signal of the AP tester is an effective value of 1V, the SNR level of one single output channel of the digital speaker system device tested by the AP tester is shown in Table 2. It can be seen from Table 2 that, in the whole frequency band range from 20 Hz to 20 KHz, one single output channel of the digital speaker system device has a SNR around 91 dB in the case of an effective input value of 1V, which shows that the SNR level of the digital speaker system device is very high, and the system device can achieve the high fidelity sound reproduction of sound source file.

TABLE 2

| Frequency (Hz) | 20 | 50 | 100 | 200 | 400 | 600 | 800 | 1000 | 2000 | 4000 | 6000 | 8000 |
|---|---|---|---|---|---|---|---|---|---|---|---|---|
| SNR (dB) | 90.2 | 91.3 | 91.2 | 91.3 | 91.3 | 91.4 | 91.4 | 91.3 | 91.3 | 91.2 | 91.3 | 91.3 |
| Frequency (Hz) | 10000 | | 12000 | | 14000 | | 16000 | | 18000 | | | |
| SNR (dB) | 91.2 | | 91.4 | | 91.2 | | 91.4 | | 91.3 | | | |

In the case that the output testing signal of the AP tester is an effective value of 1V, the harmonic distortion and noise (THD+N) level of one single output channel of the digital speaker system device tested by the AP tester is shown in Table 3. It can be seen from Table 3 that, the harmonic distortion and noise level of the digital speaker system device substantially is 0.2% in the case of an effective input value of 1V, which shows that the harmonic distortion and noise components of the digital speaker system device is very small, and the system device possesses an excellent sound field reproduction ability.

TABLE 3

| Frequency (Hz) | 20 | 50 | 100 | 200 | 400 | 600 | 800 | 1000 | 2000 | 4000 | 6000 | 8000 |
|---|---|---|---|---|---|---|---|---|---|---|---|---|
| THD + N (%) | 0.22 | 0.22 | 0.21 | 0.22 | 0.21 | 0.21 | 0.21 | 0.21 | 0.20 | 0.20 | 0.20 | 0.02 |

Embodiment 2

In the present embodiment, the speaker load driven by the digital speaker system device is a dual voice coil speaker, the resistance of one single voice coil is 4Ω, and the aperture of the dual voice coil speaker is 2.5 inches. In an anechoic room, the frequency response curve and the harmonic distortion curve of one single output channel of the system device in the case that one single voice coil of the dual voice coil speaker is switched in are measured at a distance of 1 m in the case of an output electric power of 1 W.

Figure 24:
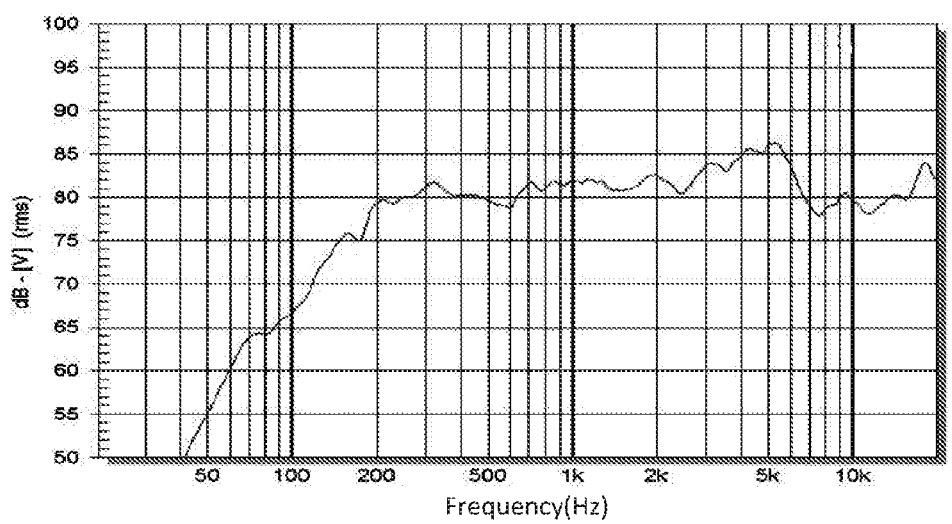
FIG. 24 shows a frequency response curve of the axial radiated sound field of the digital speaker system device at a distance of 1 meter (m) in the case of applying an electric power 1 watt (W) in the Embodiment 2 of the present invention.

FIG. 24 shows a frequency response curve of the axial radiated sound field of the digital speaker system device at a distance of 1 m in the case of applying an electric power 1 W. It can be seen from FIG. 24 that, the frequency response curve of the speaker is flat in the frequency response range from 200 Hz to 6 KHz, and appears a sink near the frequency points 600 Hz and 7 KHz, and from the whole frequency response curve, the digital speaker system device can well reproduce the sound signal, and can satisfy the high fidelity requirement of sound reproduction.

Figure 25:
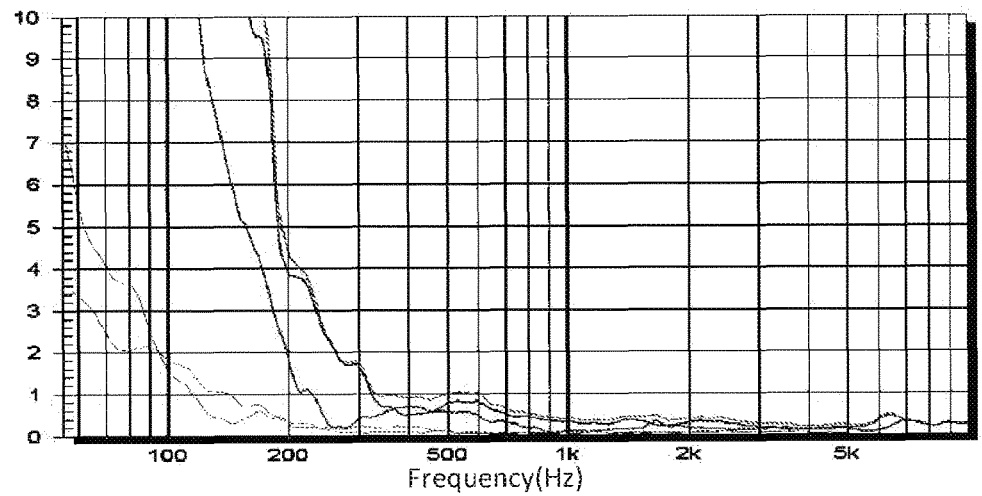
FIG. 25 shows a harmonic distortion curve of the axial radiated sound field of the digital speaker system device at a distance of 1 m in the case of applying an electric power 1 W in the Embodiment 2 of the present invention.

FIG. 25 shows a frequency response curve of the axial radiated sound field of the digital speaker system device at a distance of 1 m in the case of applying an electric power 1 W. It can be seen from FIG. 25 that, the harmonic distortion curve of the speaker has a harmonic distortion level less than 1% in the frequency response range from 400 Hz to 1 KHz, and a harmonic distortion level less than 0.5% in the frequency response range after 1 KHz. Seen from the harmonic distortion level within the whole frequency response range, the digital speaker system device can achieve the high fidelity reproduction of the sound source signal.

Embodiment 3

In the present embodiment, the speaker load driven by the digital speaker system device is a single voice coil speaker manufactured by SUZHOU SONAVOX ELECTONICS CO., LTD., the resistance of the speaker is 4Ω, and the aperture thereof is 2 inches. Referring to a portable speaker sound system—iBoxD68 purchased from the market, the difference between the power consumptions of the digital speaker system device and the purchased portable speaker sound system iBoxD68 is tested. In the testing process, the digital speaker system device and the sound system iBoxD68 employ the same power supply source, both are supplied by a lithium battery of 5V and 3000 mA; one single output channel of the digital speaker system device is switched in a 2-inch speaker unit manufactured by SONAVOX company, and one single output channel of the sound system iBoxD68 also is switched in a 2-inch speaker unit manufactured by SONAVOX company, the speaker load driven by the two systems are the same, and in the case of the same power supplying and the same output load, the power consumptions of one single output channel of the system devices driving one single speaker unit are measured.

In the case of the same power supplying and the same output load, the comparison of the power consumptions of the digital speaker system device and the sound system iBoxD68 is shown in Table 4. It can be seen from Table 4 that, except that at the frequency points 360 Hz, 880 Hz and 14700 Hz the power consumptions of the digital speaker system device are slightly less than those of the iBoxD68 system, at other frequency points, the power consumptions of the digital speaker system device are significantly less than those of the iBoxD68 system

TABLE 4

| Tested Frequency (Hz) | Sound Pressure at 40 cm from Speaker Axis (dB) | Consumed Power of Digital Speaker System (mA) | Consumed Power of iBoxD65 System (mA) | iBoxD65 - Digital Speaker (mA) |
|---|---|---|---|---|
| 360 | 76.9 | 147.5 | 123.8 | -23.7 |
| 520 | 75.2 | 151.7 | 152.7 | 1.00 |
| 700 | 73.2 | 152.7 | 172.6 | 19.9 |
| 880 | 76.2 | 152.9 | 146.7 | -6.2 |
| 1840 | 86.6 | 189.1 | 240.0 | 50.9 |
| 2600 | 87.6 | 184.6 | 230.0 | 45.4 |
| 3400 | 89.4 | 178.4 | 220.0 | 41.6 |
| 4420 | 89.1 | 174.9 | 205.0 | 30.1 |
| 5520 | 87.7 | 171.0 | 198.3 | 27.3 |
| 6300 | 83.7 | 169.8 | 195.9 | 26.1 |
| 7360 | 78.4 | 166.9 | 170.3 | 3.4 |
| 8800 | 80.8 | 163.5 | 210.0 | 46.5 |
| 11000 | 78.4 | 160.4 | 160.6 | 0.200 |
| 14700 | 80.3 | 158.3 | 140.3 | -18.0 |

In the case of without a speaker load, the power consumption of the digital speaker system device itself is 139. mA. The digital speaker system device at present employs a FPGA chip to implement, and the overall power consumption of the FPGA chip is relatively high and generally at a magnitude of 100 mA. The power saving advantage of the digital speaker system device has not been reflected very obviously, which has a direct relation to the high power consumption of the FPGA chip. If the digital speaker system device entirely employs a single discrete chip to implement, the power consumption of the digital speaker system device will have a more obvious decrease. In the case of without a speaker load, the power consumption of the iBoxD65 system itself is only 67.2 mA. The chip used in the iBoxD65 system is developed by the company itself. This can show that, if the core technology of the digital speaker system device entirely employs a chip to implement, the power consumption thereof will decrease sharply. The THD+N level of the digital speaker system at various frequency points is significantly less than that of the iBoxD65 system, and the reproduced sound quality thereof is significantly better than that of the iBoxD65 system. The current consumption of one single channel of the iBoxD65 system must not exceed 0.32 A, and if over 0.32 A, the system will auto restart, which shows that the system is designed to prevent the current consumption of the system by monitoring and controlling the current amperage of the system. The iBoxD65 system is restricted and limited by the current amperage, and has a very small output sound pressure and a small output voice.

It can be seen from Table 4 that, the digital speaker system device has a good power-saving property, and in the case that the FPGA implements the functions of the system device, when compared with the existing traditional sound products, the digital speaker system device still possesses a good power-saving property, and if the digital speaker system device entirely employs a chip to implement, the power consumption property thereof will more obvious; meanwhile, when compared with the existing sound products, the digital speaker system device has a significant decreased harmonic distortion level, and a better sound reproduction quality.

Embodiment 4

In the present embodiment, the multi-channel mismatch shapers in the digital speaker system device respectively employ a 2nd-order mismatch shaping algorithm and a 3 order mismatch shaping algorithm, and the difference between the two mismatch shaping algorithms is compared by simulation and measurement experiments.

Figure 26:
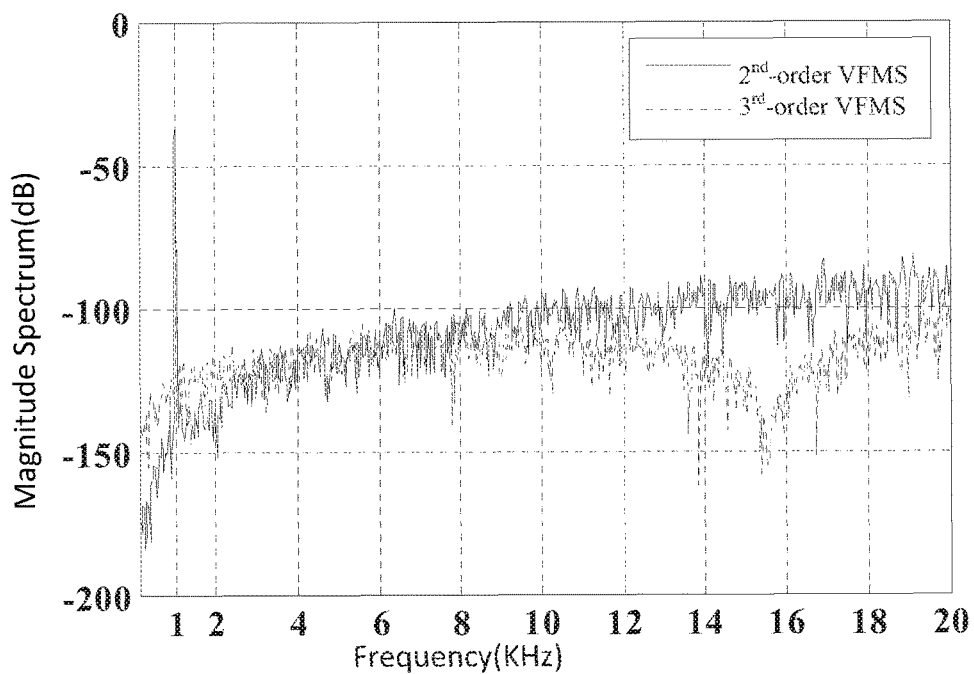
FIG. 26 shows a comparison diagram of the signal frequency spectrum output by a single speaker unit in the cases of using a 2nd-order VFMS algorithm and a 3rd-order VFMS algorithm in the Embodiment 4 of the present invention.

In the simulation experiment, assuming there is a certain amplitude error when the speaker unit radiates the state "0" or the state "1", and the error complies with a Gaussian distribution with a mean value 0 and a variance 0.01, and according to this error distribution characteristic, the signal frequency spectrum curves output by one single speaker unit in the cases that the system is simulated to use a 2nd-order VFMS algorithm and a 3rd-order VFMS algorithm, are shown in FIG. 26. It can be seen by comparing these two curves: the SNR of the 2nd-order VFMS algorithm and the 3rd-order VFMS algorithm respectively are 33 dB and 49 dB, the SNR of the 3rd-order VFMS algorithm is 16 dB more than that of the 2nd-order VFMS algorithm; the noise amplitude in low frequency region slightly increases, however, in the high frequency region, the noise amplitude decreases obviously; in order to keep the stability of the algorithm, the dynamic range of the 3rd-order VFMS algorithm is 5 dB smaller than that of the 2nd-order VFMS algorithm.

Figure 27:
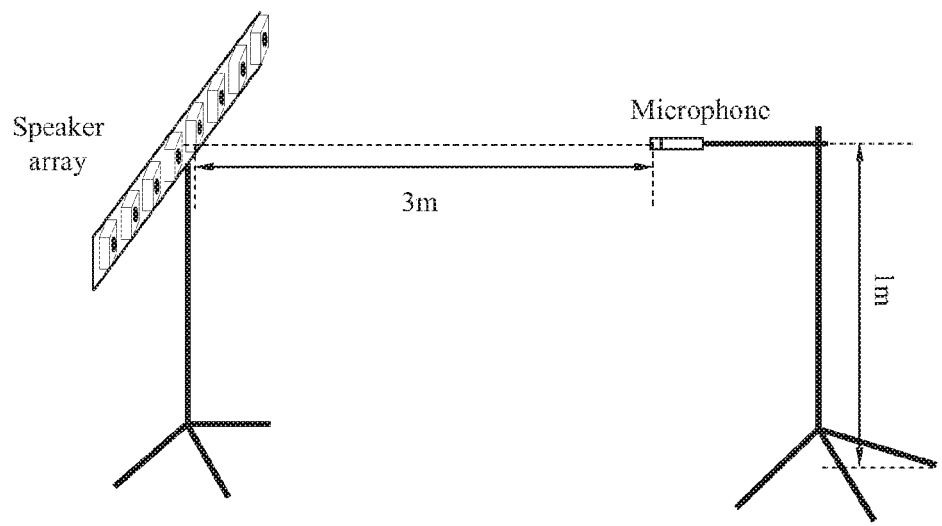
FIG. 27 shows a position arrangement diagram of the speaker array and the microphone in the measurement experiment of Embodiment 4 of the present invention.

In the anechoic room of SONAVOX company, the shaping effects of the digital speaker system device with the 2nd-order VFMS algorithm and the 3rd-order VFMS algorithm are tested. In the experiment, the location arrangement of the speaker array and the microphone is shown in FIG. 27, the centre of the array and the centre of the microphone keep in alignment with a distance of 0.5 m, the signal frequencies of the single frequency shaping signals with a amplitude ⅟32 generated inside the FPGA respectively are 500 Hz, 1 KHz, 2 KHz, 4 KHz and 8 KHz, and the measured SNR values radiated from the centre of the single speaker to the position of the microphone are as shown in Table 5.

It can be seen from Table 5 that, the 3rd-order VFMS algorithm has a significant damping effect on noise in the high frequency region over 9 KHz, but has no significant damping effect on noise in the frequency band below 9 KHz. It can be seen from the measurements in Table 5 that, the 3rd-order VFMS algorithm has an noise damping effect in a larger degree, the obtained SNR thereof is larger than that obtained by 2nd-order VFMS algorithm, however, the 3rd-order VFMS algorithm has a great difference in improving degrees of the SNR at various frequency points, at frequency points 1 KHz and 8 KHz, the SNRs are improved relatively significantly, and respectively increase 6.81 dB and 6.64 dB; at frequency point 4 KHz, the SNR is improved relatively small, and only increases 0.21 dB. The difference between the actual measurements and the theoretical value of the SNR of the 3rd-order VFMS algorithm is large, which mainly because that the hardware system (the switch transistor of the digital power amplifier, the speaker unit and other elements) has a slow response on the switching signal of the high frequency modulation, and therefore during the switching process, many non-linear distortion components is introduced, resulting in a large distortion in the modulation waveform, and thus causes the large difference between the SNR level and the theoretical result of the system.

TABLE 5

| SNR (dB) | 500 Hz | 1000 Hz | 2000 Hz | 4000 Hz | 8000 Hz |
|---|---|---|---|---|---|
| 2nd-Order VFMS | 34.09 | 30.36 | 36.81 | 35.98 | 29.12 |
| 3rd-Order VFMS | 37.92 | 37.17 | 38.87 | 36.19 | 35.76 |

The position of the microphone is adjusted, such that the array centre has a distance of 0.1 m to the microphone, and the SNR measurement experiment is re-conducted, and the measured SNR data is shown in Table 6. It can be seen from the two groups of data that, in the two different distance cases, the SNR improvement degrees at various frequency band do not exactly identical, while in both the two different distance cases, the 3rd-order VFMS algorithm has a larger SNR improvement degree than that of the 2nd-order VFMS algorithm, and has an improvement in the range of 1 dB~6 dB at various frequency points.

TABLE 6

| SNR (dB) | 500 Hz | 1000 Hz | 2000 Hz | 4000 Hz | 8000 Hz |
|---|---|---|---|---|---|
| 2nd-Order VFMS | 43.28 | 45.51 | 47.63 | 34.45 | 25.01 |
| 3rd-Order VFMS | 49.39 | 48.25 | 48.62 | 37.28 | 28.04 |

Embodiment 5

Figure 28:
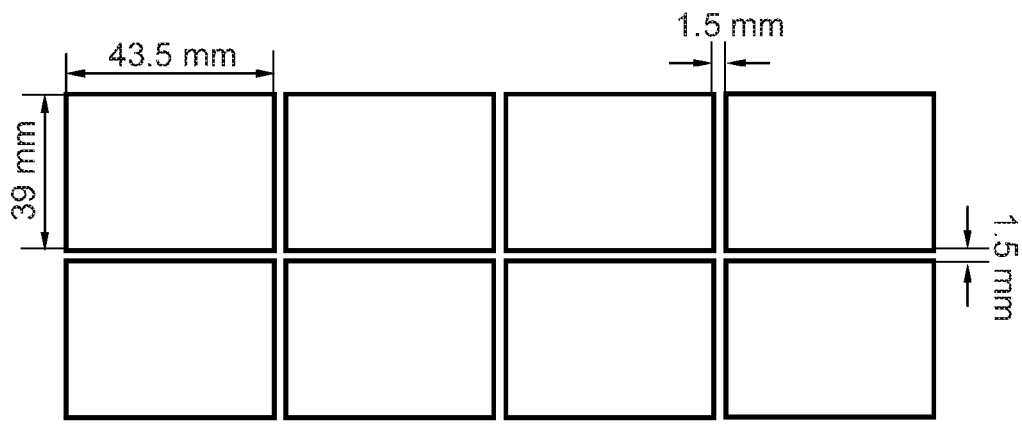
FIG. 28 shows a position arrangement diagram of the array elements of the speaker array in Embodiment 5 of the present invention.
Figure 29:
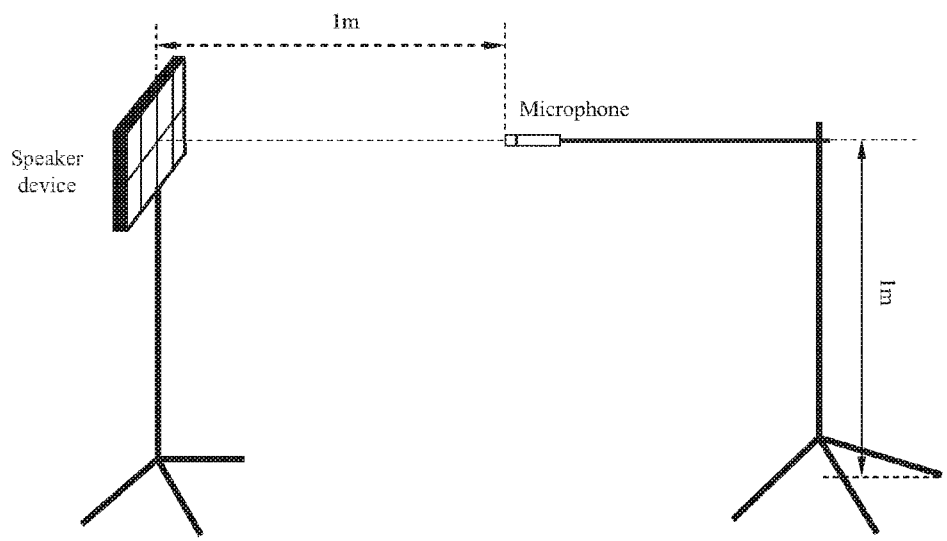
FIG. 29 shows a position arrangement diagram of the speaker array and the microphone in Embodiment 5 of the present invention.

In the present embodiment, the performance levels of the digital speaker system device in the case of driving a speaker array load is analysed by simulation and measurement experiments. FIG. 28 shows the array element arrangement of the speaker array, and FIG. 29 shows the arrangements of the speaker device and the microphone, wherein the centre of the speaker device is 1 m away from the microphone, and the microphone is 1 m away from the ground.

Figure 30:
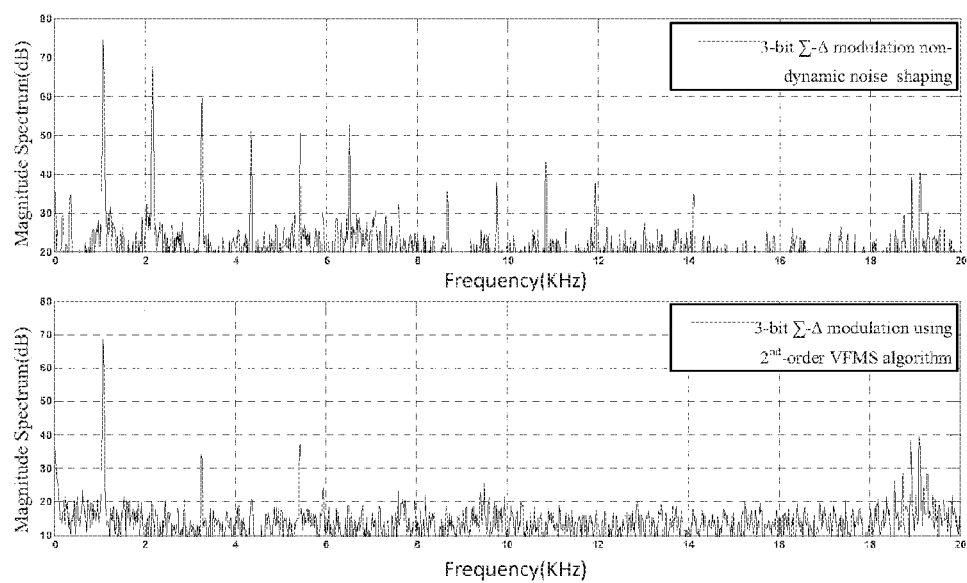
FIG. 30 shows a graph of the effect of eliminating the non-linear harmonic distortion of the dynamic mismatch shaper when the digital speaker system device plays a sinusoidal signal of a single frequency 1 KHz in the measurement experiment of the Embodiment 5 of the present invention.

FIG. 30 shows a graph of the effect of eliminating the non-linear harmonic distortion of the dynamic mismatch shaper when the digital speaker system device plays a sinusoidal signal of a single frequency 1 KHz in the measurement experiment; it can be seen that, when the device outputs a 1 KHz signal after adding the VFMS dynamic mismatch shaping algorithm, the harmonic component is significantly reduced, which shows that the dynamic mismatch shaper has the ability of eliminating the non-linear harmonic distortion.

Figure 31:
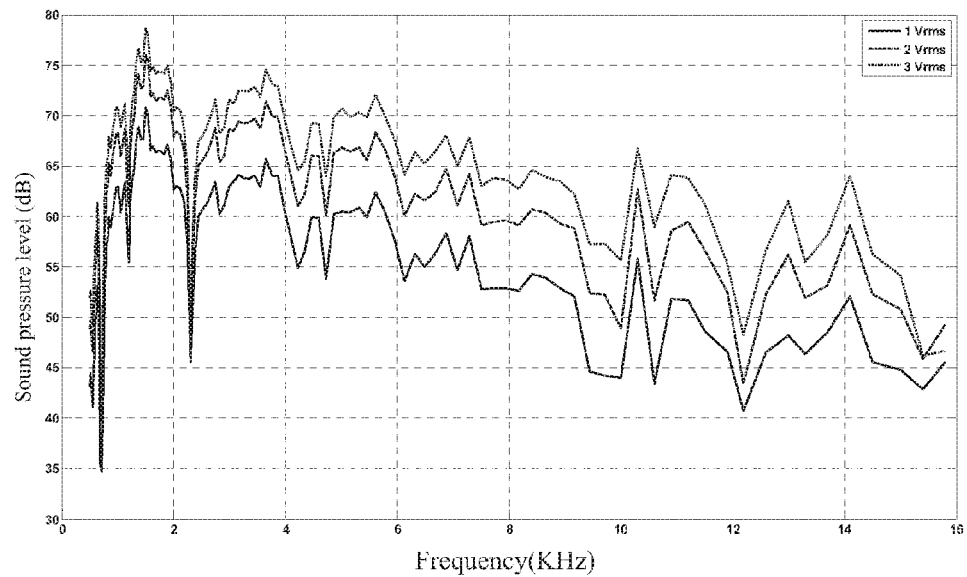
FIG. 31 shows amplitude-frequency response curves of the system device acquired at a distance of 1 m when the system device inputs swept-frequency signals according to effective values of 1V, 2V and 3V in the measurement experiment of the Embodiment 5 of the present invention.
Figure 32:
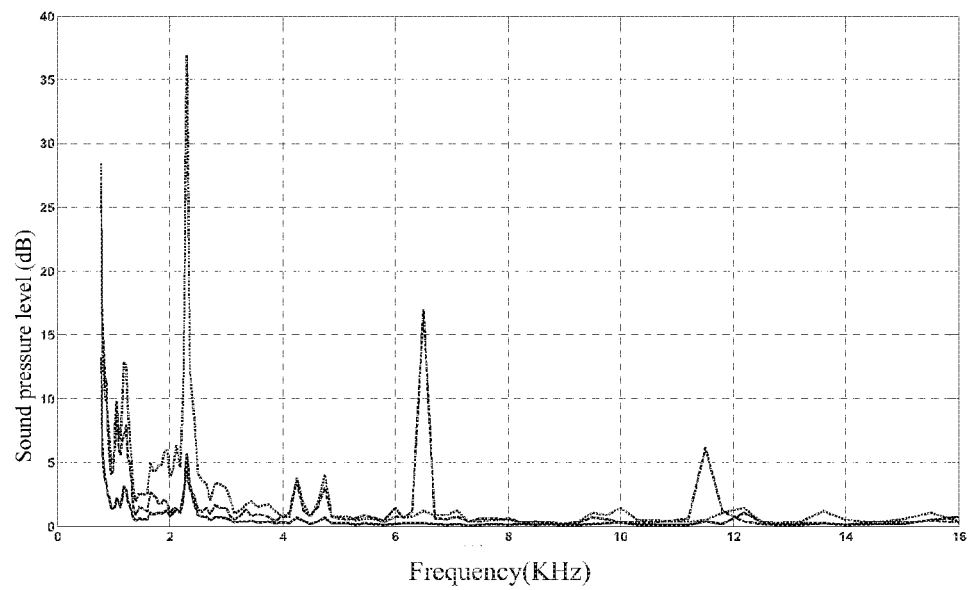
FIG. 32 shows total harmonic distortion curves of the system device acquired at a distance of 1 m when the system device inputs swept-frequency signals according to effective values of 1V, 2V and 3V in the measurement experiment of the Embodiment 5 of the present invention.

FIG. 31 shows amplitude-frequency response curves of the system device acquired at a distance of 1 m when the system device inputs swept-frequency signals according to effective values of 1V, 2V and 3V. It can be seen from the figure that, the frequency response of the system decreases seriously in a frequency over 8 KHz, which relates to the frequency response property of the selected speaker unit; due to that the selected speaker unit in the present embodiment itself has a large attenuation of the amplitude-frequency response in the frequency over 8 KHz, the amplitude-frequency response of the 8-element array system also attenuates largely; moreover, with increasing of the input voltage of the system, the amplitude of the sound pressure output by the system will increase gradually. FIG. 32 shows the total harmonic distortion curve of the system device, and it can be seen from the figure that, the total harmonic distortion nearby the low frequency region around 1 KHz is larger, which suggests that the quality level of the signal output by the system at low frequency band is poor, and away from the low frequency band, the harmonic distortion of the signal output by the system is small, generally below 1%; moreover, with increasing of the voltage amplitude of the input signal, the harmonic distortion of the system increases gradually, and several frequency points, the harmonic distortion varies seriously.

Figure 33:
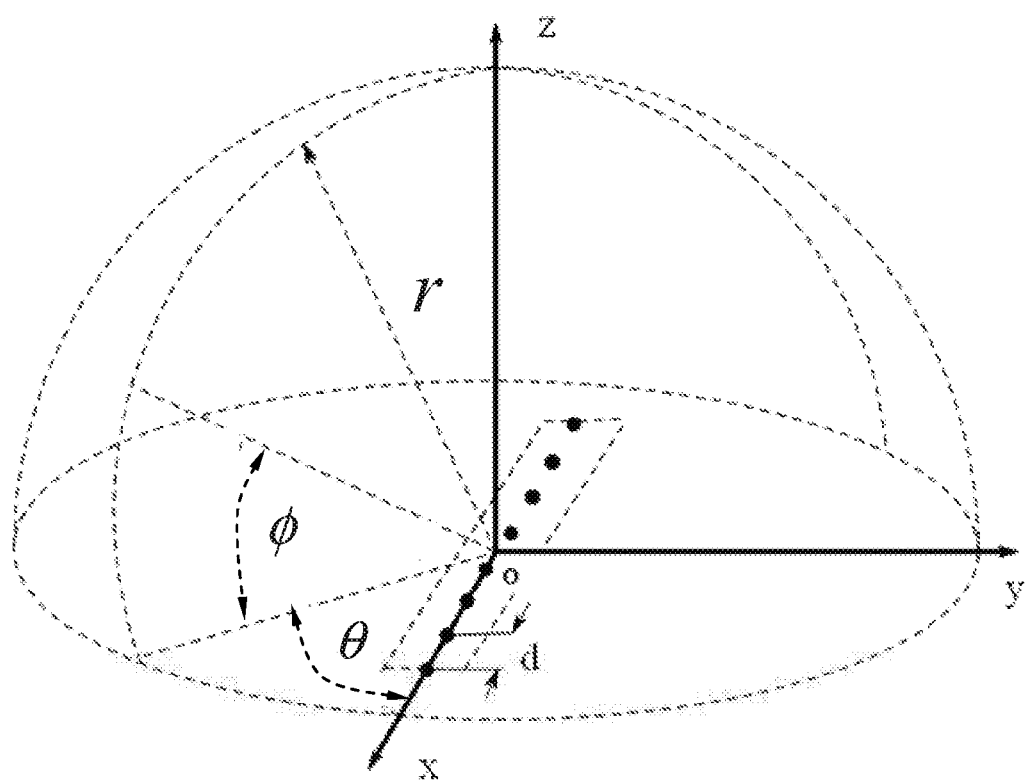
FIG. 33 shows a position arrangement diagram of an eight-element linear array in the simulation experiment of Embodiment 5 of the present invention.
Figure 34:
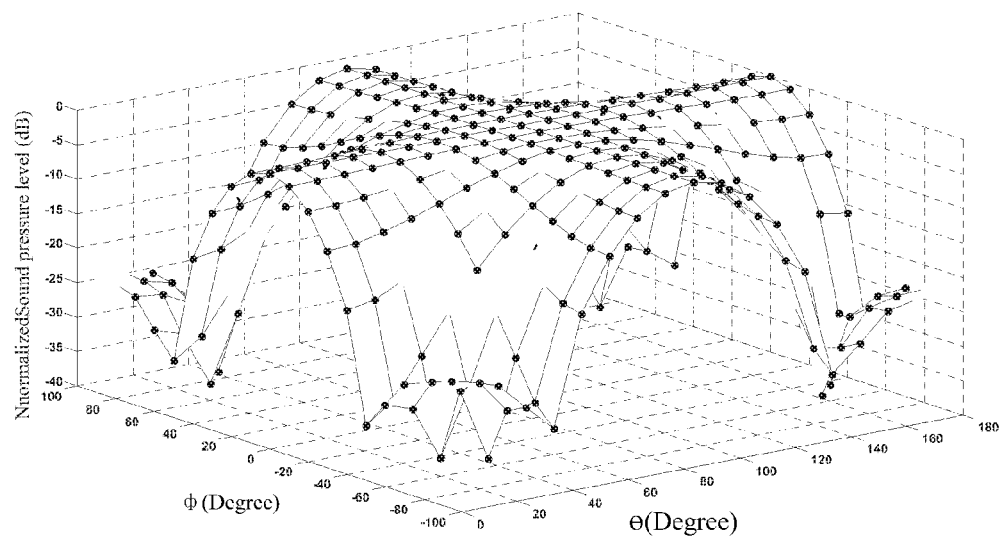
FIG. 34 shows an amplitude distribution diagram of the spacial sound field generated by the eight-element linear array in the simulation experiment of Embodiment 5 of the present invention.
Figure 35:
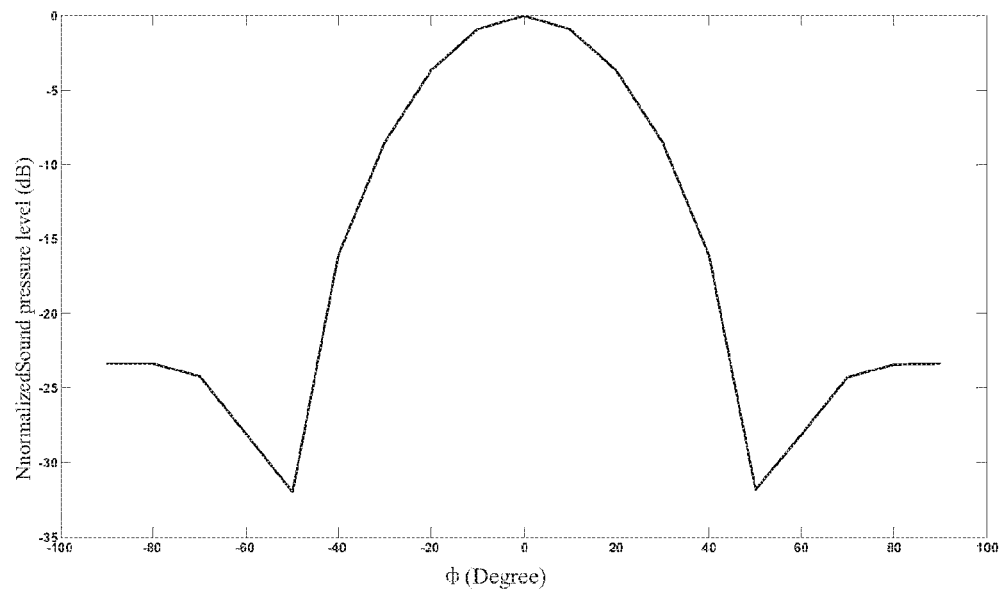
FIG. 35 shows an amplitude changing curve of the sound field of the eight-element linear array at various positions when φ varies from −90 degree to +90 degree at θ=0 degree, in the simulation experiment of Embodiment 5 of the present invention.
Figure 36:
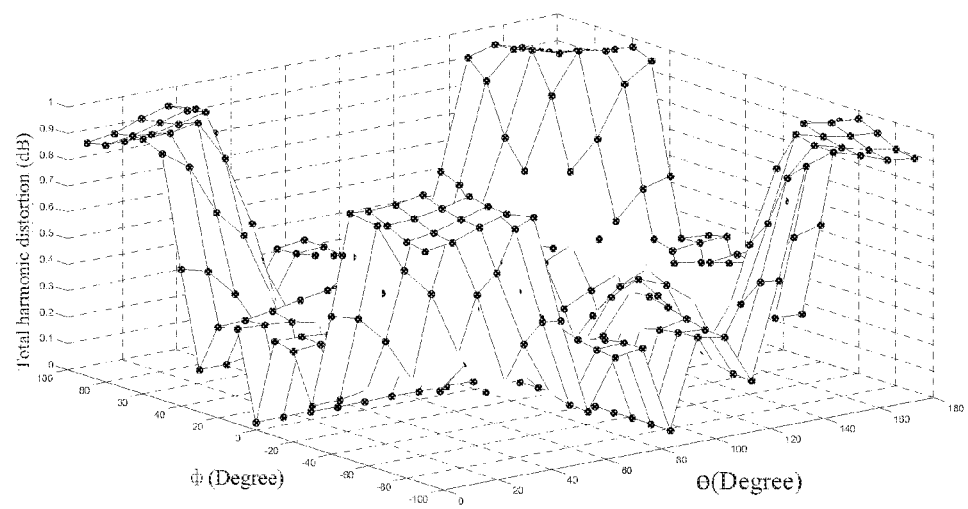
FIG. 36 shows a total harmonic distortion diagram of the sound field signal generated by the eight-element linear array at various space positions, in the simulation experiment of Embodiment 5 of the present invention.
Figure 37:
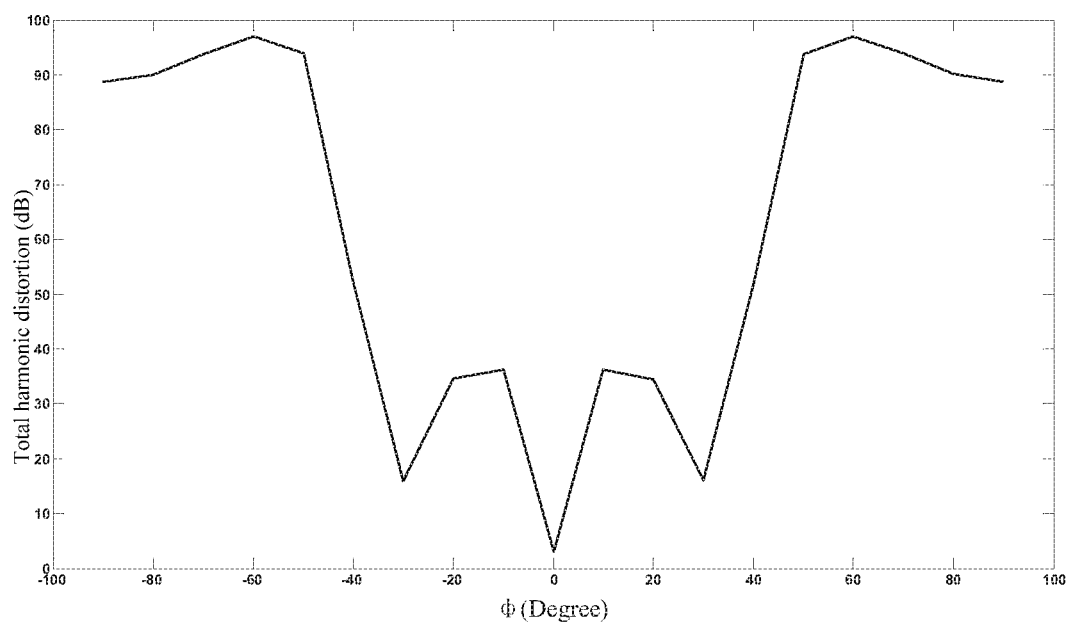
FIG. 37 shows a changing curve of the total harmonic distortion of the sound field signal of the eight-element linear array at various positions when d varies from −90 degree to +90 degree at e=0 degree, in the simulation experiment of Embodiment 5 of the present invention.

For explaining the control ability on the spacial sound field of the system device, the sound field distribution when the array elements have a large spacing is simulated. As shown in FIG. 33, 8 speaker units are arranged to form a linear array according to a spatial position with an array spacing 0.1 m; then a 1 KHz single frequency sinusoidal signal is sent to the system, generated into a 3-bit Δ-Σ coded signal by the Δ-Σ modulator, converted into a binary coded data stream of 8 channels, and sent to the 8 speaker unit to conduct spacial radiate, and by linear superpositioning the radiated sound fields from these units, the spacial sound field distribution and the total harmonic distortion curve of the 8-element array are obtained, as shown in FIGS. 34, 35, 36 and 37. FIG. 34 shows an amplitude distribution diagram of the radiated sound field at a radiation radius r=5 m of the system at a spacial position; FIG. 35 shows an amplitude changing curve of the sound field radiated by the system during φ varies from −90 degree to +90 degree at θ=0 degree. It can be seen from the curves that, the sound pressure distribution in the region nearby the symmetry axis of the linear array is flat and varies gently, and in the region departing from the symmetry axis of the linear array, the attenuation of the sound pressure is larger and about 25 dB, which suggests that the present system device has a certain control ability on the spacial sound field, and by means of selecting a larger array aperture and a higher modulation bits, the present device can keep a distribution of large sound pressure in the axis symmetry areas of the linear array, and have a significant attenuation away from the symmetry areas. FIG. 36 shows a total harmonic distortion distribution diagram of the radiated sound field signals at a radiation radius r=5 m of the system at a spacial position; FIG. 37 shows a total harmonic distortion changing curve of the sound field signals radiated by the system during φ varies from −90 degree to +90 degree at e=0 degree. It can be seen from the curves that, the total harmonic distortion in the region nearby the symmetry axis of the array is small, which suggests that the sound quality of the signal is very good, and in the spacial region departing from the symmetry axis of the array, the total harmonic distortion increases rapidly, which suggests that the sound quality of the signal decreases significantly.

It can be seen from the simulating curves that, in the case that the array has a relatively large aperture size, the system manufactured according to the present invention has a relatively obvious control effect on the sound field, and the control effect on the sound field is different from that formed by a conventional linear array beam, because the signals radiated by each array element channel is part of the bit information, while the signals radiated by each array element channel of the conventional beam is a cope of the sound source signal, and it is because the signals radiated by each array element of the system have different information content, the sound field generated by this system in space not only has amplitude changes of the sound pressure, but also has different changes in harmonic distortion, intelligibility and tone quality, which suggests that the system manufactured according to the present invention has a better local sound field control ability, and thus provides a preferable implementation manner for private transmission of voice.

It should be noted that, the above embodiments are only for illustrating the technical schemes of the present invention, rather than limiting. Although the present invention is described in detail referring to the embodiments, and it should be understood by those ordinary skilled in the art that any modifications or equivalent variations of the technical schemes of the present invention does not depart from the spirit and scope of the technical schemes of the invention, and should be covered by the protective scope of the present invention.

What is claimed is:

1. An implementation method of a multi-bit Δ-Σ modulation-based digital speaker system, comprising the following steps,
   1) converting an input sound source file by digital format converting, to generate a Pulse Code Modulation (PCMB) coded signal with a bit width N and a sampling frequency $f_o$;
   2) filtering the PCM coded signal with the bit width N and the sampling frequency $f_o$ by oversampling interpolation filtering according to a specified oversampling rate $O_{SR}$, to obtain a PCM coded signal with a bit width N and a sampling frequency $f_{osr}=O_{SR} \cdot f_o$;
   3) multi-bit Δ-Σ modulating the PCM coded signal with the bit width N and the sampling frequency $f_{osr}=O_{SR} \cdot f_o$, to generate a PCM coded signal with a bit width M and a sampling frequency, $f_{osr}$, wherein M<N;
   4) thermometer-coding the PCM coded signal with the bit width M and the sampling frequency $f_{osr}$, to convert it to a parallel binary coded signal with a sampling frequency $f_{osr}$ and corresponding to $2^M$ digital channels of digital power amplifiers and speaker loads;
   5) multichannel mismatch shaping by adjusting an output sequence of a parallel coded stream generated from the binary coded signal with the sampling frequency $f_{osr}$ and corresponding to $2^M$ digital channels by a random sorting method, to randomly select output channels;
   6) converting the binary coded signal with the sampling frequency $f_{osr}$ and corresponding to $2^M$ digital channels by coding format converting, to a 1-bit Pulse Width Modulation (PWM) coded data stream with a sampling frequency $f_{dsr}=f_{osr}/D_{SR}$ and corresponding to $2^M$ channels, wherein $D_{SR}>1$;
   7) digital power amplifying the 1-bit PWM coded data stream with the sampling frequency $f_{dsr}=f_{osr}/D_{SR}$ and corresponding to $2^M$ channels, to generate a power amplified digital switch electrical signal; and
   8) cooperating multiple speaker units in a speaker array or multiple voice coils in a multiple voice coil speaker to complete a sonic-electric conversion, and to convert the digital switch electrical signal to an analog sound signal.

2. The implementation method of the digital speaker system according to claim 1, characterized in that,
(i) when the input sound source file has an analog format, the format converting comprises: converting the sound source file by analog-digital converting, into a Pulse Code Modulation (PCM) coded format based digital signal, which then being converted, according to a system specified bit width N and a specified sampling frequency $f_o$, into a PCM coded signal with the bit width N and the sampling frequency $f_o$;
or
when the input sound source file has a digital format, the format converting comprises: converting the sound source file, according to a system specified bit width N and a specified sampling frequency $f_o$, into a PCM coded signal with the bit width N and the sampling frequency $f_o$.

3. The implementation method of the digital speaker system according to claim 1, characterized in that, the oversampling interpolation filtering in the step 2), is achieved by employing a digital circuit, generating an oversampled digital signal with the specified oversampling rate of $O_{SR}$ by a multiplied cascaded structure of a Finite Impulse Response (FIR) interpolation filter structure and a Cascaded Integrator Comb (CIC) interpolation filter, the specified oversampling rate $O_{SR}$ being produced by at least one FIR interpolation filter and at least one CIC interpolation filter cascaded in proper order.

4. The implementation method of the digital speaker system according to claim 3, characterized in that, in the multiplied cascaded structure employed by oversampling interpolation filtering, the CIC interpolation filter is employed in the last stage, and the FIR interpolation filter is employed in each of the other stages, the CIC interpolation filter being consisted of a comb filter and an integrating filter, a multiplied cascade of the comb filter and the integrating filter accomplishing the interpolation filtering processing.

5. The implementation method of the digital speaker system according to claim 1, characterized in that, the binary coded signal in the step 4), has only two electric level states "0" and "1" at any time, when in the "0" state, a speaker load is switched off, and when in the "1" state, the speaker load is switched on.

6. The implementation method of the digital speaker system according to claim 1, characterized in that, the multi-channel mismatch shaping in the step 5) employs any one of a Data-Weighted Averaging (DWA) mismatch shaping algorithm, a second order Vector-Feedback Mismatch-Shaping (VFMS) mismatch shaping algorithm and a second order Tree-Structure Mismatch Shaping (TSMS) algorithm.

7. The implementation method of the digital speaker system according to claim 1, characterized in that, the multi-channel mismatch shaping in the step 5) employs a Vector-Feedback Mismatch-Shaping VFMS mismatch shaping algorithm, the formula of the VFMS mismatch shaping algorithm being $$\frac{(z-1)\cdot(z^2-1.994z+1)}{(z-0.6685)\cdot(z^2-1.529z+0.6629)}.$$

8. The implementation method of the digital speaker system according to claim 1, characterized in that, the multi-channel mismatch shaping in the step 5) is achieved by an Input Signal Amplitude Optimization-Dynamic Element Mismatched (ISAO-DEM) mismatch shaping algorithm, the ISAO-DEM algorithm dynamically adjusting the number of channels participating in mismatch shaping according to the amplitude of an input signal, and disposing the rest of the channels not participating in shaping to close or sleep.

9. The implementation method of the digital speaker system according to claim 8, characterized in that, the ISAO-DEM mismatch shaping algorithm dynamically adjusts speaker units or speaker coils participating in mismatch shaping according to a principle that the harmonic distortion of a super-positioned sound field being whitened as far as possible.

10. The implementation method of the digital speaker system according to claim 9, characterized in that, the ISAO-DEM algorithm controls the speaker units or the speaker coils to be averagely used according to a clock tick.

11. The implementation method of the digital speaker system according to claim 1, characterized in that, the multi-channel digital amplifying in the step 7), indicates that in each channel the 1-bit PWM coded data stream with the sampling frequency $f_{dsr}=f_{osr}/D_{SR}$ and corresponding to $2^M$ channels after the coding format converting, as well as the switch control signal forming a difference between the signal and an inversion signal thereof, are to control an on-off action of a full-bridge power amplifier circuit.

12. A multi-bit Δ-Σ modulation-based digital speaker system, characterized in that, comprising:
a digital input interface (1) to convert an input sound source file by digital format converting, to generate a Pulse Code Modulation (PCM) coded signal with a bit width N and a sampling frequency $f_o$;
an oversampling interpolation filter (2), connected with an output of the digital input interface (1), and to filter the PCM coded signal with the bit width N and the sampling frequency $f_o$ by oversampling interpolation filtering according to a specified oversampling rate $O_{SR}$, to obtain a PCM coded signal with a bit width N and a sampling frequency $f_{osr}=O_{SR}\cdot f_o$;
a multi-bit Δ-Σ modulator (3), of which an input being connected with an output of the oversampling interpolation filter (2), and which is to multi-bit Δ-Σ modulate the PCM coded signal with the bit width N and the sampling frequency $f_{osr}=O_{SR}\cdot f_o$, to generate a PCM coded signal with a bit width M and a sampling frequency $f_{osr}$, wherein M<N;
a thermometer coder (4), of which an input being connected with an output of the multi-bit Δ-Σ modulator (3), and which is to thermometer-code the PCM coded signal with the bit width M and the sampling frequency $f_{osr}$, to convert it to a parallel binary coded signal with a sampling frequency $f_{osr}$ and corresponding to $2^M$ digital channels of digital power amplifiers and speaker loads;
a multichannel mismatch shaper (5), of which an input being connected with an output of the thermometer coder (4), and which is to adjust an output sequence of a parallel coded stream generated from the binary coded signal with the sampling frequency $f_{osr}$ and corresponding to $2^M$ digital channels by a random sorting method, to randomly select output channels;
a coding format converter (6), connected with an output of the multichannel mismatch shaper (5), and to convert the binary coded signal with the sampling frequency $f_{osr}$ and corresponding to $2^M$ digital channels by coding format converting, to a 1-bit Pulse Width Modulation (PWM) coded data stream with a sampling frequency $f_{dsr}=f_{osr}/D_{SR}$ and corresponding to $2^M$ channels, wherein $D_{SR}>1$;

a multi-channel digital power amplifier (7), of which an input being connected with an output of the coding format converter (6), and which is to digital power amplify the 1-bit PWM coded data stream with the sampling frequency $f_{dsr}=f_{osr}/D_{SR}$ and corresponding to $2^M$ channels, to generate a power amplified digital switch electrical signal;

a speaker array or a multiple voice coil speaker (8), of which an input being connected with an output of the multi-channel digital power amplifier (7), and multiple speaker units in the speaker array or multiple voice coils in the multiple voice coil speaker cooperating to accomplish a sonic-electric converting operation, to convert the digital switch electrical signal to an analog sound signal.

13. The digital speaker system device according to claim 12, characterized in that, when the sound source file has an analog format, the digital input interface (1) converts the sound source file into a Pulse Code Modulation (PCM) coded format based digital signal by analog-digital converting, and converts, according to a system specified sampling frequency $f_o$ and a specified bit width N, into the PCM coded signal with the bit width N and the sampling frequency $f_o$;

or when the sound source file has an analog format, the digital input interface (1) converts the sound source file into a PCM coded format based digital signal by analog-digital converting, and converts, according to a system specified sampling frequency $f_o$ and a specified bit width N, into the PCM coded signal with the bit width N and the sampling frequency $f_o$.

14. The digital speaker system device according to claim 12, characterized in that, the oversampling interpolation filter (2) has at least one Finite Impulse Response (FIR) interpolation filter and at least one Cascaded Integrator Comb (CIC) interpolation filter multiplied cascaded.

15. The digital speaker system according to claim 12, characterized in that, the multichannel mismatch shaper (5) comprises, an error generating module (21), a shaping processing module (22), a minimum searching module (23), a subtraction operation module (24) and a quantizer module (25);

the error generating module (21) is configured to compare a coding error between an input coded signal and an output coded signal of the thermometer coder (4), and to output coding error values of the $2^M$ channels;

the shaping processing module (22) is configured to shaping process the coding error values input by the error generating module (21) according to a designed mismatch shaping function, and to output shaped coding error signals;

the minimum searching module (23) is configured to receive the shaped coding error signals from the shaping processing module (22), search for a minimum value within the transmitted data of the channels, and output the minimum value;

the subtraction operation module (24) is configured to receive the shaped coding error signals from the shaping processing module (22), and the minimum value in the transmitted data obtained by sorting treatment from the minimum searching module (23), by means of subtraction operation, is subtracted from the shaped coding error signals, and to output subtraction-processed multi-channel signals; and the quantizer module (25) comprises multiple groups of comparators configured to generate $2^M$ quantized level stages and to send the quantized level stages to the thermometer coder (4) by which a conversion from single channel of M-bit PCM code to $2^M$ channels of 1-bit Pulse Density Modulation (PDM) codes is completed.

16. The digital speaker system according to claim 12, characterized in that, the coding format converter (6) comprises a Δ-Σ modulator (26) and a PWM modulator (27);

the Δ-Σ modulator (26) is configured to complete a conversion from the 1-bit PDM coded signal to a PCM coded signal with a low bit width L; and the PWM modulator (27) is configured to complete a conversion from the PCM coded signal with a low bit width L to a PWM coded signal.

17. The digital speaker system according to claim 12, characterized in that, the multi-channel digital power amplifier (7) comprises, a gate driver (28), a Metal Oxide Semiconductor Field Effect Transistor (MOSFET) power transistor (29) and a feedback network (30);

the gate driver (28) is configured to convert the PWM coded signal generated by the coding format converter (6) into a switch control signal driving the MOSFET power transistor to conduct a turn-on/turn-off operation;

the MOSFET power transistor (29) is configured to conduct turn-on/turn-off operation in a high speed according to the switch control signal of the gate driver (28), and thereby drive the speaker to sound; and the feedback network (30) is configured to convert a power signal on a lead of the speaker into a small amplitude signal and send the small amplitude signal to the PWM modulator (27), realize a feedback correction function, reduce a harmonic wave and noise of power amplifying, and improve a performance level of power amplifying.

18. The digital speaker system according to claim 12, characterized in that, in the speaker array or the multiple voice coil speaker (8), all speaker units or all voice coils are connected with the digital power amplifier (7) to complete a complete synthesis and reproduction of an audio signal by cooperation of the multiple units or the multiple voice coils.

* * * * *